United States Patent
Pick et al.

(10) Patent No.: US 11,909,533 B2
(45) Date of Patent: Feb. 20, 2024

(54) REPORTING REDUNDANCY VERSION WITH FEEDBACK INFORMATION

(71) Applicant: QUALCOMM Incorporated, San Diego, CA (US)

(72) Inventors: Jacob Pick, Beit Zayit (IL); Assaf Touboul, Netanya (IL); Shay Landis, Hod Hasharon (IL); Shlomit Shaked, Rosh haayin (IL)

(73) Assignee: QUALCOMM Incorporated, San Diego, CA (US)

( * ) Notice: Subject to any disclaimer, the term of this patent is extended or adjusted under 35 U.S.C. 154(b) by 29 days.

(21) Appl. No.: 17/571,331

(22) Filed: Jan. 7, 2022

(65) Prior Publication Data

US 2023/0224093 A1    Jul. 13, 2023

(51) Int. Cl.
| | | |
|---|---|---|
| *H04L 1/00* | (2006.01) | |
| *H04L 1/1812* | (2023.01) | |
| *H04W 76/18* | (2018.01) | |
| *H04W 72/23* | (2023.01) | |
| *H03M 13/25* | (2006.01) | |

(52) U.S. Cl.
CPC ........ *H04L 1/1819* (2013.01); *H03M 13/255* (2013.01); *H04L 1/0057* (2013.01); *H04L 1/0061* (2013.01); *H04W 72/23* (2023.01); *H04W 76/18* (2018.02)

(58) Field of Classification Search
CPC ... H04L 1/1812; H04L 1/1819; H04L 1/0057; H04L 1/0061; H04W 76/18; H03M 13/09; H03M 13/2906; H03M 13/255
See application file for complete search history.

(56) References Cited

U.S. PATENT DOCUMENTS

| | | | |
|---|---|---|---|
| 10,523,373 B2 * | 12/2019 | Chen | H04L 1/1896 |
| 10,541,788 B2 * | 1/2020 | You | H04L 1/1812 |
| 10,892,860 B2 * | 1/2021 | Wang | H04W 72/53 |
| 11,252,754 B2 * | 2/2022 | Babaei | H04L 1/1671 |
| 11,411,687 B2 * | 8/2022 | Park | H04L 1/1819 |
| 11,418,964 B2 * | 8/2022 | Alriksson | H04L 1/1887 |
| 11,553,557 B2 * | 1/2023 | Noh | H04L 5/10 |
| 2018/0227077 A1 | 8/2018 | Lee et al. | |

FOREIGN PATENT DOCUMENTS

EP    1638239 A1    3/2006

OTHER PUBLICATIONS

International Search Report and Written Opinion—PCT/US2022/082288—ISA/EPO—dated Apr. 6, 2023.

\* cited by examiner

*Primary Examiner* — Esaw T Abraham
(74) *Attorney, Agent, or Firm* — Holland & Hart LLP

(57) ABSTRACT

Methods, systems, and devices for reporting redundancy version with feedback information. are described. A user equipment (UE) may transmit, to a base station, feedback information corresponding to a code block group in conjunction with an indication of a redundancy version for retransmission of the code block group. The UE may monitor for the retransmission of the code block group based on the indication of the redundancy version for the retransmission of the code block group. The UE may then decode the retransmission of the code block group based on the monitoring and the redundancy version for the retransmission of the code block group.

18 Claims, 16 Drawing Sheets

| $rv_{id}$ [$b_3b_2b_1b_0$] 305 | $k_0$ 310 ||
| --- | --- | --- |
| | LDPC base graph 1 315 | LDPC base graph 2 320 |
| 0 | 0 | 0 |
| 1 | $\lfloor 3N_{cb}/(66Z_c)\rfloor Z_c$ | $\lfloor 2N_{cb}/(50Z_c)\rfloor Z_c$ |
| 2 | $\lfloor 7N_{cb}/(66Z_c)\rfloor Z_c$ | $\lfloor 5N_{cb}/(50Z_c)\rfloor Z_c$ |
| 3 | $\lfloor 11N_{cb}/(66Z_c)\rfloor Z_c$ | $\lfloor 8N_{cb}/(50Z_c)\rfloor Z_c$ |
| 4 | $\lfloor 15N_{cb}/(66Z_c)\rfloor Z_c$ | $\lfloor 11N_{cb}/(50Z_c)\rfloor Z_c$ |
| 5 | $\lfloor 19N_{cb}/(66Z_c)\rfloor Z_c$ | $\lfloor 14N_{cb}/(50Z_c)\rfloor Z_c$ |
| 6 | $\lfloor 23N_{cb}/(66Z_c)\rfloor Z_c$ | $\lfloor 17N_{cb}/(50Z_c)\rfloor Z_c$ |
| 7 | $\lfloor 27N_{cb}/(66Z_c)\rfloor Z_c$ | $\lfloor 20N_{cb}/(50Z_c)\rfloor Z_c$ |
| 8 | $\lfloor 31N_{cb}/(66Z_c)\rfloor Z_c$ | $\lfloor 23N_{cb}/(50Z_c)\rfloor Z_c$ |
| 9 | $\lfloor 35N_{cb}/(66Z_c)\rfloor Z_c$ | $\lfloor 26N_{cb}/(50Z_c)\rfloor Z_c$ |
| 10 | $\lfloor 39N_{cb}/(66Z_c)\rfloor Z_c$ | $\lfloor 29N_{cb}/(50Z_c)\rfloor Z_c$ |
| 11 | $\lfloor 43N_{cb}/(66Z_c)\rfloor Z_c$ | $\lfloor 32N_{cb}/(50Z_c)\rfloor Z_c$ |
| 12 | $\lfloor 47N_{cb}/(66Z_c)\rfloor Z_c$ | $\lfloor 35N_{cb}/(50Z_c)\rfloor Z_c$ |
| 13 | $\lfloor 51N_{cb}/(66Z_c)\rfloor Z_c$ | $\lfloor 38N_{cb}/(50Z_c)\rfloor Z_c$ |
| 14 | $\lfloor 55N_{cb}/(66Z_c)\rfloor Z_c$ | $\lfloor 41N_{cb}/(50Z_c)\rfloor Z_c$ |
| 15 | $\lfloor 59N_{cb}/(66Z_c)\rfloor Z_c$ | $\lfloor 44N_{cb}/(50Z_c)\rfloor Z_c$ |

REPORTING REDUNDANCY VERSION WITH FEEDBACK INFORMATION

FIELD OF TECHNOLOGY

The following relates to wireless communication at a user equipment (UE), including reporting redundancy version with feedback information.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM).

A wireless multiple-access communications system may include one or more base stations or one or more network access nodes, each simultaneously supporting communication for multiple communication devices, which may be otherwise known as user equipment (UE). In some examples, UEs may support feedback transmission in response to receiving a data transmission. IN some instances, feedback transmission techniques may be improved.

SUMMARY

The described techniques relate to improved methods, systems, devices, and apparatuses that support reporting redundancy version with feedback information. Generally, the described techniques provide for a user equipment (UE) to report a redundancy version in conjunction with feedback information. The UE may unsuccessfully receive or decode one or more code block groups and may determine a redundancy version for retransmission of the one or more code block groups. In some cases, the UE may determine the redundancy version based on the incremental redundancy buffer status. The UE may transmit, to a base station, an indication of the redundancy version in conjunction with feedback information. In some cases, the UE may transmit the indication of the redundancy version via uplink control information. Additionally or alternatively, the UE may transmit a negative acknowledgment message including the indication of the redundancy version.

A method for wireless communication at user equipment (UE) is described. The method may include transmitting, to a base station, feedback information corresponding to a code block group in conjunction with an indication of a redundancy version for a retransmission of the code block group, monitoring for the retransmission of the code block group based on transmitting the indication of the redundancy version for the retransmission of the code block group, and decoding the retransmission of the code block group in accordance with the monitoring and the redundancy version for the retransmission of the code block group.

An apparatus for wireless communication at UE is described. The apparatus may include a memory, and a processor coupled to the memory and configured to transmit, to a base station, feedback information corresponding to a code block group in conjunction with an indication of a redundancy version for a retransmission of the code block group, monitor for the retransmission of the code block group based on transmitting the indication of the redundancy version for the retransmission of the code block group, and decode the retransmission of the code block group in accordance with the monitoring and the redundancy version for the retransmission of the code block group.

Another apparatus for wireless communication at UE is described. The apparatus may include means for transmitting, to a base station, feedback information corresponding to a code block group in conjunction with an indication of a redundancy version for a retransmission of the code block group, means for monitoring for the retransmission of the code block group based on transmitting the indication of the redundancy version for the retransmission of the code block group, and means for decoding the retransmission of the code block group in accordance with the monitoring and the redundancy version for the retransmission of the code block group.

A non-transitory computer-readable medium storing code for wireless communication at UE is described. The code may include instructions executable by a processor to transmit, to a base station, feedback information corresponding to a code block group in conjunction with an indication of a redundancy version for a retransmission of the code block group, monitor for the retransmission of the code block group based on transmitting the indication of the redundancy version for the retransmission of the code block group, and decode the retransmission of the code block group in accordance with the monitoring and the redundancy version for the retransmission of the code block group.

Some examples of the method, apparatuses, and non-transitory computer-readable medium described herein may further include operations, features, means, or instructions for receiving, from the base station, a downlink transmission associated with the code block group including a set of multiple code blocks and determining that at least one code block of the set of multiple code blocks may be not processed at the UE, where transmitting the indication of the redundancy version for the retransmission of the code block group may be based on the determining.

Some examples of the method, apparatuses, and non-transitory computer-readable medium described herein may further include operations, features, means, or instructions for determining the redundancy version for the retransmission of the code block group based on an incremental redundancy buffer status, where transmitting the indication of the redundancy version for the retransmission of the code block group includes transmitting the indication of the determined redundancy version.

Some examples of the method, apparatuses, and non-transitory computer-readable medium described herein may further include operations, features, means, or instructions for determining that a downlink transmission associated with the code block group may be scheduled for a set of time periods, refraining from processing the downlink transmission on at least one time period of the set of time periods, and determining the redundancy version for the retransmission of the code block group based on the refraining.

Some examples of the method, apparatuses, and non-transitory computer-readable medium described herein may further include operations, features, means, or instructions for estimating failure of an upcoming reception of a transport block associated with the code block group and determining the redundancy version for the retransmission of the code block group based on the estimating.

In some examples of the method, apparatuses, and non-transitory computer-readable medium described herein, transmitting the indication of the redundancy version may include operations, features, means, or instructions for transmitting, via uplink control information, the indication of the redundancy version for the retransmission of the code block group.

In some examples of the method, apparatuses, and non-transitory computer-readable medium described herein, transmitting the indication of the redundancy version may include operations, features, means, or instructions for transmitting a negative acknowledgement message including the indication of the redundancy version for the retransmission of the code block group.

In some examples of the method, apparatuses, and non-transitory computer-readable medium described herein, the negative acknowledgement message includes a set of bits indicating a starting position in a low-density parity-check code base graph. In some examples of the method, apparatuses, and non-transitory computer-readable medium described herein, the UE and the base station support four or more than four redundancy versions.

A method for wireless communication at a base station is described. The method may include receiving, from a UE, feedback information corresponding to a code block group in conjunction with an indication of a redundancy version for a retransmission of the code block group and transmitting, to the UE, the retransmission of the code block group based on receiving the indication of the redundancy version for the retransmission of the code block group.

An apparatus for wireless communication at a base station is described. The apparatus may include a memory, and a processor coupled to the memory and configured to cause the apparatus to receive, from a UE, feedback information corresponding to a code block group in conjunction with an indication of a redundancy version for a retransmission of the code block group and transmit, to the UE, the retransmission of the code block group based on receiving the indication of the redundancy version for the retransmission of the code block group.

Another apparatus for wireless communication at a base station is described. The apparatus may include means for receiving, from a UE, feedback information corresponding to a code block group in conjunction with an indication of a redundancy version for a retransmission of the code block group and means for transmitting, to the UE, the retransmission of the code block group based on receiving the indication of the redundancy version for the retransmission of the code block group.

A non-transitory computer-readable medium storing code for wireless communication at a base station is described. The code may include instructions executable by a processor to receive, from a UE, feedback information corresponding to a code block group in conjunction with an indication of a redundancy version for a retransmission of the code block group and transmit, to the UE, the retransmission of the code block group based on receiving the indication of the redundancy version for the retransmission of the code block group.

Some examples of the method, apparatuses, and non-transitory computer-readable medium described herein may further include operations, features, means, or instructions for transmitting, to the UE, a downlink transmission associated with the code block group including a set of multiple code blocks, where receiving the indication of the redundancy version for the retransmission of the code block group may be based on at least one code block of the set of multiple code blocks not being processed at the UE.

In some examples of the method, apparatuses, and non-transitory computer-readable medium described herein, receiving the indication of the redundancy version may include operations, features, means, or instructions for receiving the indication of the redundancy version for the retransmission of the code block group based on an incremental redundancy buffer status at the UE.

In some examples of the method, apparatuses, and non-transitory computer-readable medium described herein, receiving the indication of the redundancy version may include operations, features, means, or instructions for receiving, via uplink control information, the indication of the redundancy version for the retransmission of the code block group.

In some examples of the method, apparatuses, and non-transitory computer-readable medium described herein, receiving the indication of the redundancy version may include operations, features, means, or instructions for receiving a negative acknowledgement message including the indication of the redundancy version for the retransmission of the code block group.

BRIEF DESCRIPTION OF THE DRAWINGS

FIG. 3 illustrates an example of a redundancy version table that supports reporting redundancy version with feedback information in accordance with aspects of the present disclosure.

DETAILED DESCRIPTION

Figure 1:
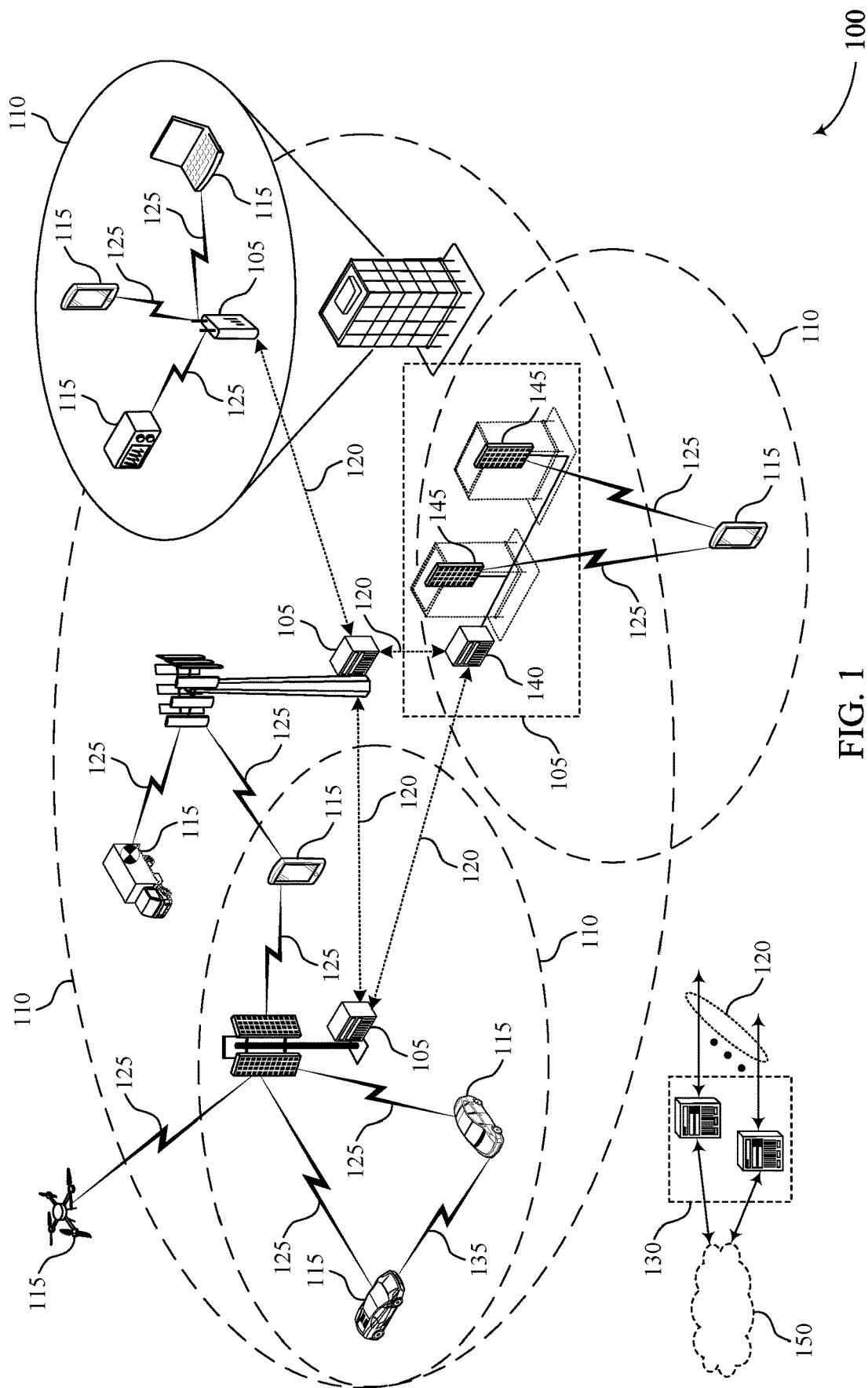
FIG. 1 illustrates an example of a wireless communications system that supports reporting redundancy version with feedback information in accordance with aspects of the present disclosure.

Some wireless communications systems may support transmission of feedback information upon failure to receive or process a downlink transmission. For example, a first device (e.g., a user equipment (UE)) may receive one or more transport blocks included in a downlink transmission from a second device (e.g., a base station), and may attempt to decode the downlink transmission. Each transport block may include one or more code block groups and each code block group may further include one or more code blocks. The first device may transmit feedback to the second device to indicate whether the first device has successfully decoded the transmission. If the first device successfully decodes the transport block, the first device may transmit an acknowledgement message as feedback. If the first device fails to successfully receive and/or decode part or all of the downlink transmission (e.g., all code blocks within a code block group), the first device may transmit a negative acknowledgement message as feedback. Upon receiving the negative acknowledgement message, the second device may retransmit the downlink transmission using a redundancy version indicating a cyclic shift of the start of the retransmission. The second device may select the redundancy version based on a predefined order.

In some examples, the first device may be unable to successfully decode the retransmission based on the redundancy version used for the retransmission, and the first device may request additional retransmissions. For example, a UE may estimate failure of an upcoming reception of a transport block and may decide not to process a downlink transmission. The UE may transmit a negative acknowledgment message to a base station. The base station may receive the negative acknowledgment message and may transmit the retransmission with a redundancy version (RV) based on a predefined order (e.g., RV 2). In this example, the UE may use a different redundancy version (e.g., RV 0) to successfully decode the retransmission. Therefore, the UE may request one or more additional retransmissions to be able to successfully decode the retransmission, thus increasing the complexity and latency.

In accordance with the techniques described herein, a first device (e.g., a UE) may transmit to a second device (e.g., a base station) a requested redundancy version in conjunction with feedback information upon failure to receive or process a downlink transmission. For example, a first device may unsuccessfully decode one or more code blocks received via a downlink transmission from a second device. The first device may determine a redundancy version for an upcoming retransmission (e.g., based on an incremental redundancy buffer status) and may transmit the redundancy version to the second device in conjunction with a negative acknowledgement message. In some examples, the first device may include the redundancy version in an uplink control information. Upon receiving the requested redundancy version, the second device may transmit a retransmission of the transport block based on the redundancy version indicated by the first device. The first device may successfully receive and decode the retransmission (e.g., pass a cyclic redundancy check (CRC)). Additionally or alternatively, the value of the redundancy version may be of a finer granularity (e.g., greater than four values). Thus, transmitting a redundancy version of a finer granularity along with feedback information may improve throughput and coverage by enabling the second device (e.g., base station) to determine a retransmission as well as to reduce a number of network retransmissions, improving overall network capacity.

Aspects of the disclosure are initially described in the context of wireless communications systems. Aspects of the disclosure are further described in the context of a process flow. Aspects of the disclosure are further illustrated by and described with reference to apparatus diagrams, system diagrams, and flowcharts that relate to reporting redundancy version with feedback information.

FIG. 1 illustrates an example of a wireless communications system 100 that supports reporting redundancy version with feedback information in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

In some examples (e.g., in a carrier aggregation configuration), a carrier may also have acquisition signaling or control signaling that coordinates operations for other carriers. A carrier may be associated with a frequency channel (e.g., an evolved universal mobile telecommunication system terrestrial radio access (E-UTRA) absolute radio frequency channel number (EARFCN)) and may be positioned according to a channel raster for discovery by the UEs 115. A carrier may be operated in a standalone mode where initial acquisition and connection may be conducted by the UEs 115 via the carrier, or the carrier may be operated in a non-standalone mode where a connection is anchored using a different carrier (e.g., of the same or a different radio access technology).

The communication links 125 shown in the wireless communications system 100 may include uplink transmissions from a UE 115 to a base station 105, or downlink transmissions from a base station 105 to a UE 115. Carriers may carry downlink or uplink communications (e.g., in an FDD mode) or may be configured to carry downlink and uplink communications (e.g., in a TDD mode).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of determined bandwidths for carriers of a particular radio access technology (e.g., 1.4, 3, 5, 10, 15, 20, 40, or megahertz (MHz)). Devices of the wireless communications system 100 (e.g., the base stations 105, the UEs 115, or both) may have hardware configurations that support communications over a particular carrier bandwidth or may be configurable to support communications over one of a set of carrier bandwidths. In some examples, the wireless communications system 100 may include base stations 105 or UEs 115 that support simultaneous communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may include one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., N f) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

Each base station 105 may provide communication coverage via one or more cells, for example a macro cell, a small cell, a hot spot, or other types of cells, or any combination thereof. The term "cell" may refer to a logical communication entity used for communication with a base station 105 (e.g., over a carrier) and may be associated with an identifier for distinguishing neighboring cells (e.g., a physical cell identifier (PCID), a virtual cell identifier (VCID), or others). In some examples, a cell may also refer to a geographic coverage area 110 or a portion of a geographic coverage area 110 (e.g., a sector) over which the logical communication entity operates. Such cells may range from smaller areas (e.g., a structure, a subset of structure) to larger areas depending on various factors such as the capabilities of the base station 105. For example, a cell may be or include a building, a subset of a building, or exterior spaces between or overlapping with geographic coverage areas 110, among other examples.

A macro cell generally covers a relatively large geographic area (e.g., several kilometers in radius) and may allow unrestricted access by the UEs 115 with service subscriptions with the network provider supporting the macro cell. A small cell may be associated with a lower-powered base station 105, as compared with a macro cell, and a small cell may operate in the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A base station 105 may support one or multiple cells and may also support communications over the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

In some systems, the D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., base stations 105) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, for example, in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

The UEs 115 and the base stations 105 may support retransmissions of data to increase the likelihood that data is received successfully. Hybrid automatic repeat request (HARQ) feedback is one technique for increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the medium access control layer in poor radio conditions (e.g., low signal-to-noise conditions). In some examples, a device may support same-slot HARQ feedback, where the device may provide HARQ feedback in a specific slot for data received in a previous symbol in the slot. In other cases, the device may provide HARQ feedback in a subsequent slot, or according to some other time interval.

Some wireless communications systems may support transmission of feedback information upon failing to receive or process a downlink transmission. For example, a base station 105 may transmit a downlink transmission to a UE 115, and the UE 115 may determine that the transmission has failed (e.g., not received or not processed). Upon failure to receive or process a transmission, the UE 115 may transmit a feedback message (e.g., negative acknowledgment message) to the base station 105. The base station 105 may then retransmit the downlink transmission using a redundancy version indicating a cyclic shift of the start of the retransmission.

As used herein, the term "redundancy version" may refer to a specific encoding of the downlink transmission for reencoding according to an incremental redundancy scheme. The encoding of each redundancy version may be defined by the incremental redundancy scheme and known to both the UE 115 and the base station 105. In some cases, the encoding for each redundancy version may be standardized. For example, each redundancy version may correspond to a column position of a base graph (described with reference to FIG. 3) used by the base station 105 to transmit one or more bits. The base station 105 may select a value for the redundancy version based on a predefined order. However, in some cases, the UE 115 may be unable to successfully decode the retransmission based on the redundancy version and may request additional retransmissions.

To improve communication efficiency, aspects depicted herein provide for a UE 115 to transmit a requested redundancy version in conjunction with feedback information (e.g., a negative acknowledgement message) to a base station 105 upon failure to receive a downlink transmission. In some examples, a UE 115 may transmit, to a base station 105, feedback information corresponding to a code block group in conjunction with an indication of a redundancy version for a retransmission of the code block group. The UE 115 may then monitor for the retransmission of the code block group based on transmitting the indication of the redundancy version for the retransmission of the code block group. Upon receiving the retransmission, the UE 115 may decode the retransmission of the code block group in accordance with the monitoring and the redundancy version for the retransmission of the code block group.

Figure 2:
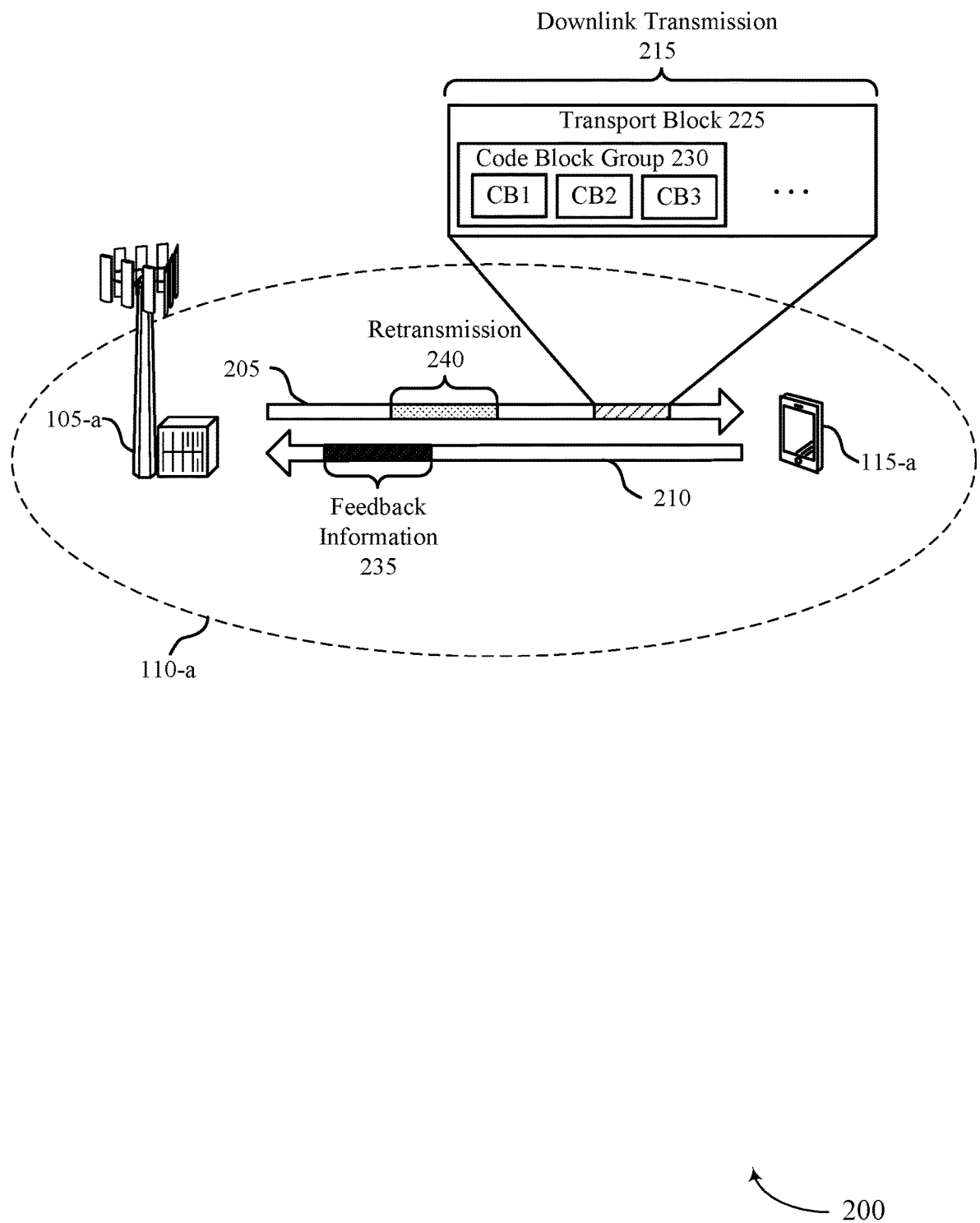
FIG. 2 illustrates an example of a wireless communications system that supports reporting redundancy version with feedback information in accordance with aspects of the present disclosure.

FIG. 2 illustrates an example of a wireless communications system 200 that supports reporting redundancy version with feedback information in accordance with aspects of the present disclosure. In some examples, the wireless communications system 200 may implement aspects of wireless communications system 100. The wireless communications system 200 may include a base station 105-*a* and a UE 115-*a* (may also be referred to as devices) operating in geographic coverage area 110-*a*.

As depicted in the example of FIG. 2, a first wireless device (e.g., the UE 115-*a*) may receive a downlink transmission 215 from a second wireless device (e.g., the base station 105-*a*). For example, the UE 115-*a* may receive one or more transport blocks via a transmission from the base station 105-*a*. As depicted herein, the UE 115-*a* may receive a transport block 225 included in the downlink transmission 215. Each transport block may include one or more code block groups and each code block group may include one or more code blocks. For example, the transport block 225 includes code block group 230 and the code block group 230 includes three code blocks (CB1, CB2, and CB3). Although depicted as three code blocks, it is to be understood that the code block group 230 may include any number of code blocks. Similarly, although depicted as a single code block group 230, it is to be understood that the transport block 225 may include any number of code block groups.

The UE 115-*a* may attempt to decode each code block within the transport block 225. The UE 115-*a* may transmit feedback to the base station 105-*a* to indicate whether the UE 115-*a* has successfully decoded the transmission. In some cases, the first wireless device (e.g., the UE 115-*a*) may transmit feedback information 235 to the second wireless device (e.g., the base station 105-*a*) upon failure to receive or process a downlink transmission. For instance, upon failing to receive the transport block 225, the UE 115-*a* may transmit a negative acknowledgement message. If the UE 115-*a* successfully decodes all code blocks within a transmission, then the UE 115-*a* may transmit an acknowledgement message as feedback. If the UE 115-*a* fails to successfully receive and/or decode part of or all of the transmission (e.g., decodes a subset of the code blocks in the transmission), then the UE 115-*a* may transmit a negative acknowledgement as feedback.

According to one or more aspects of the present disclosure, the UE 115-*a* may transmit feedback information corresponding to a code block group in conjunction with an indication of a redundancy version for a retransmission of the code block group. For example, upon failure to receive and/or decode the downlink transmission 215, the UE 115-*a* may transmit the feedback information 235 including an indication of a redundancy version for a retransmission of the code block group. In some cases, the redundancy version may indicate a cyclic shift of a start of the retransmission 240. Thus, the base station 105-*a* may use this information to determine the redundancy version for the retransmission 240.

In some examples, the UE 115-*a* may store decoding information for the transmission (e.g., log-likelihood ratios (LLRs) in an incremental redundancy buffer), for example, to aid in decoding of future retransmissions. In some cases, the UE 115-*a* may successfully decode a first subset of the code blocks in the downlink transmission 215 and may be unsuccessful in decoding a second subset of the code blocks in the downlink transmission 215. For instance, the UE 115-*a* may determine that at least one code block of the code block group 230 is not processed at the UE 115-*a*. In some cases, the UE 115-*a* may transmit an indication of the redundancy version for the retransmission of the code block group 230 based on the determining. In some examples, the UE 115-*a* may determine the redundancy version for the retransmission of the code block group 230 based on an incremental redundancy buffer status. Upon determining that the decoding procedure for the second subset of the code blocks was unsuccessful, the UE 115-*a* may store decoding information for the second subset of the code blocks.

Additionally or alternatively, the UE 115-*a* may be unsuccessful to decode all of the code blocks in the downlink transmission 215 and may store decoding information for the entire transmission. The base station 105-*a* may send a retransmission 240 of part or all of the transmission based on the negative feedback message (e.g., the feedback information 235 including the indication of redundancy version). For example, the base station 105-*a* may transmit one or more redundancy versions. For some redundancy versions, the retransmission 240 may include all or most of the data, such as all or most of the code blocks in the transmission, which may result in a relatively high reliability or likelihood of successful reception of the packet. Additionally or alternatively, for some redundancy versions, the retransmission 240 may include portions of the data, such as a subset of the code blocks, that the UE 115-*a* may combine decoding information with buffered decoding information to obtain the full transmission, which may result in reduced signaling overhead. Further, the redundancy version may be 0, 1, 2, 3 or any other number, and the UE 115-*a* may determine the redundancy version based on a predefined order. In some cases, the base station 105-*a* may retransmit the transport block using a redundancy version that the UE 115-*a* is unable to successfully decode.

As an illustrative example, the base station 105-*a* may transmit downlink transmission 215 to the UE 115-*a*. The downlink transmission 215 may include multiple code block groups, including code block group 230. The code block group 230 may include one or more code blocks, including CB1, CB2, and CB3. The UE 115-*a* may successfully decode CB1 and CB2 but fail to decode CB3. Therefore, the UE 115-a may store decoding information for CB3. In some examples, the UE 115-a may transmit feedback information 235 for the failed transmission. As depicted herein, the UE 115-a may transmit the feedback information 235 corresponding to the code block group 230 (based on failing to decode CB3 of the code block group 230) in conjunction with an indication of a redundancy version for a retransmission of the code block group 230. The base station 105-a may transmit retransmission 240 based on the feedback information 235. Without indicating the redundancy version, a redundancy version for a retransmission may be based decoding information for CB1 due to the predefined selection order. Therefore, a UE 115 may be unable to successfully decode the retransmission, resulting in extraneous transmissions and poor communication efficiency.

In accordance with the techniques described herein, a first device (e.g., the UE 115-a) may transmit to the second device (e.g., the base station 105-a) a requested redundancy version in conjunction with feedback information upon failure to receive or process a transmission (e.g., downlink transmission 215). In some cases, the UE 115-a may transmit an indication of the redundancy version in conjunction with a negative acknowledgement message. Additionally or alternatively, the UE 115-a may transmit an indication of the redundancy version as part of uplink control information. The base station 105-a may use the indication of the redundancy version to determine the redundancy version for an upcoming retransmission, such that the probability that the next transmission will be received correctly will increase. In the example where the UE 115-a successfully decodes CB1 and CB2, but fails to decode CB3, the UE 115-a may determine a redundancy version corresponding to storage of decoding information for code block group 230, which includes CB3, and transmit feedback information 235 to the base station 105-a, where feedback information 235 is a negative acknowledgement message corresponding to code block group 230 and includes an indication of the requested redundancy version. In some examples, the redundancy version may be a non-self-decodable redundancy version. Non-self-decodable data may refer to data packets that are not decodable in a single transmission (e.g., multiple transmissions may carry different data of the data packet). The base station 105-a may transmit the retransmission 240 to the UE 115-a using the requested redundancy version indicated in feedback information 235 and the UE 115-a may successfully receive and decode the retransmission 240.

In some cases, the UE 115-a may determine a redundancy version based on the incremental redundancy buffer status (e.g., if the UE 115-a has received, 0, 1, 2, or 3 transmissions). That is, the UE 115-a may perform an assessment of the incremental redundancy buffer to determine the decoding information stored for a failed transmission. In such cases, the UE 115-a may estimate the redundancy version for the retransmission based on the incremental redundancy buffer status. For example, the UE 115-a may estimate that reception of an upcoming transmission of a transport block 225 may fail and may decide not to decode the transmission. Additionally or alternatively, the UE 115-a may determine that the downlink transmission 215 associated with the code block group 230 is scheduled for a set of time periods (e.g., slots). The UE 115-a may refrain from processing the downlink transmission 215 on at least one time period of the set of time periods. In such cases, the UE 115-a may determine the redundancy version (as RV0) for the retransmission of the code block group 230 based on the refraining. Upon refraining from decoding the transmission, the UE 115-a may determine that the incremental redundancy buffer is storing no decoding information for the transmission (e.g., the UE 115-a has received 0 transmissions). Accordingly, the UE 115-a may determine the redundancy version for the retransmission as a self-decodable redundancy version (e.g., RV0). For example, the base station 105-a may transmit the downlink transmission 215 and the UE 115-a may estimate that it will fail to receive the downlink transmission 215. Therefore, the UE 115-a may refrain from decoding the downlink transmission 215 and may transmit the feedback information 235 indicating a self-decodable redundancy version (e.g., RV0). The base station 105-a may transmit the retransmission 240 with the self-decodable redundancy version (e.g., RV0) as indicated in the feedback information 235, which the UE 115-a is able to successfully decode. In some examples, self-decodable data may refer to data packets that are decodable in a single transmission.

In some cases, the UE 115-a may report a redundancy version having a finer granularity (e.g., more than 4 redundancy versions), as described further with reference to FIG. 3. For example, the UE 115-a may determine that the redundancy version for a retransmission 240 indicates a cyclic shift of 3 quarters of the incremental redundancy buffer (e.g., a redundancy version that may not correspond to RV 0, 1, 2, or 3). Therefore, the UE 115-a may transmit an indication of a redundancy version having a finer granularity corresponding to a cyclic shift of 3 quarters of the incremental redundancy buffer. Additionally or alternatively, the feedback information 235 (e.g., negative acknowledgement message) may include multiple bits (e.g., 3 or 4 bits or more) corresponding to the redundancy version and indicating the starting position of a low-density parity-check base graph. The low-density parity-check code may be used to correct channel errors by maintaining parity bits for a selection of the data bits. Transmitting a redundancy version with a finer granularity in conjunction with feedback information may improve throughput and coverage by enabling the base station 105-a to determine an upcoming retransmission as well as reduce a number of network retransmissions, improving overall network capacity.

FIG. 3 illustrates an example of a redundancy version table 300 that supports reporting redundancy version with feedback information in accordance with aspects of the present disclosure. As depicted herein, a UE 115 may indicate a redundancy version for a retransmission of a code block group in conjunction with feedback information corresponding to a code block group.

In some examples, the feedback information corresponding to a code block group may be a negative acknowledgement message. In such cases, the negative acknowledgement message may include multiple bits allocated for the redundancy version (e.g., more than 3 bits). The bits may also indicate the starting position at a low-density parity-check code base graph. The low-density parity-check code may correct channel errors by maintaining parity bits for a selection of the data bits. For example, the negative acknowledgement message may include an indication of an $rv_{id}$ 305 as shown in the first column of the table in FIG. 3. The $rv_{id}$ 305 may indicate a redundancy version as determined by the UE. The base station may use the indicated $rv_{id}$ 305 to determine $k_0$ 310. In some examples, $k_0$ 310 may be the offset between the slot where the control message (e.g., downlink control information) is received and the slot where data is scheduled. In some cases (e.g., larger transport blocks), $k_0$ 310 may be based on a low-density parity-check code base graph 1 315, as shown in the second column of the table in FIG. 3. Additionally or alternatively, the $k_0$ 310 may be based on a low-density parity-check code base graph 2 320 (e.g., for small transport blocks), as shown in the third column of the table in FIG. 3.

For example, a UE 115 may unsuccessfully receive or decode part or all of a downlink transmission. The UE 115 may a redundancy version for the retransmission based on the incremental redundancy buffer status for the failed downlink transmission. As an illustrative example, the redundancy version may correspond to an $rv_{id}$ 305 of 13. The UE 115 may transmit an indication of an $ry_{id}$ 305 of 13 in a negative acknowledgement message to a base station 105 as feedback in response to a failed downlink transmission. The base station 105 may receive the feedback message and determine), $k_0$ 310 based on the $ry_{id}$ 305 of 13. In some cases, such as if the transport block of the retransmissions is large, the base station 105 may determine $k_0$ 310 based on a low-density parity-check code base graph 1 315. In some other cases, such as if the transport block of the retransmissions is small, the base station 105 may determine $k_0$ 310 based on a low-density parity-check code base graph 2 320. The base station 105 may then transmit the retransmission based on the requested redundancy version.

Figure 4:
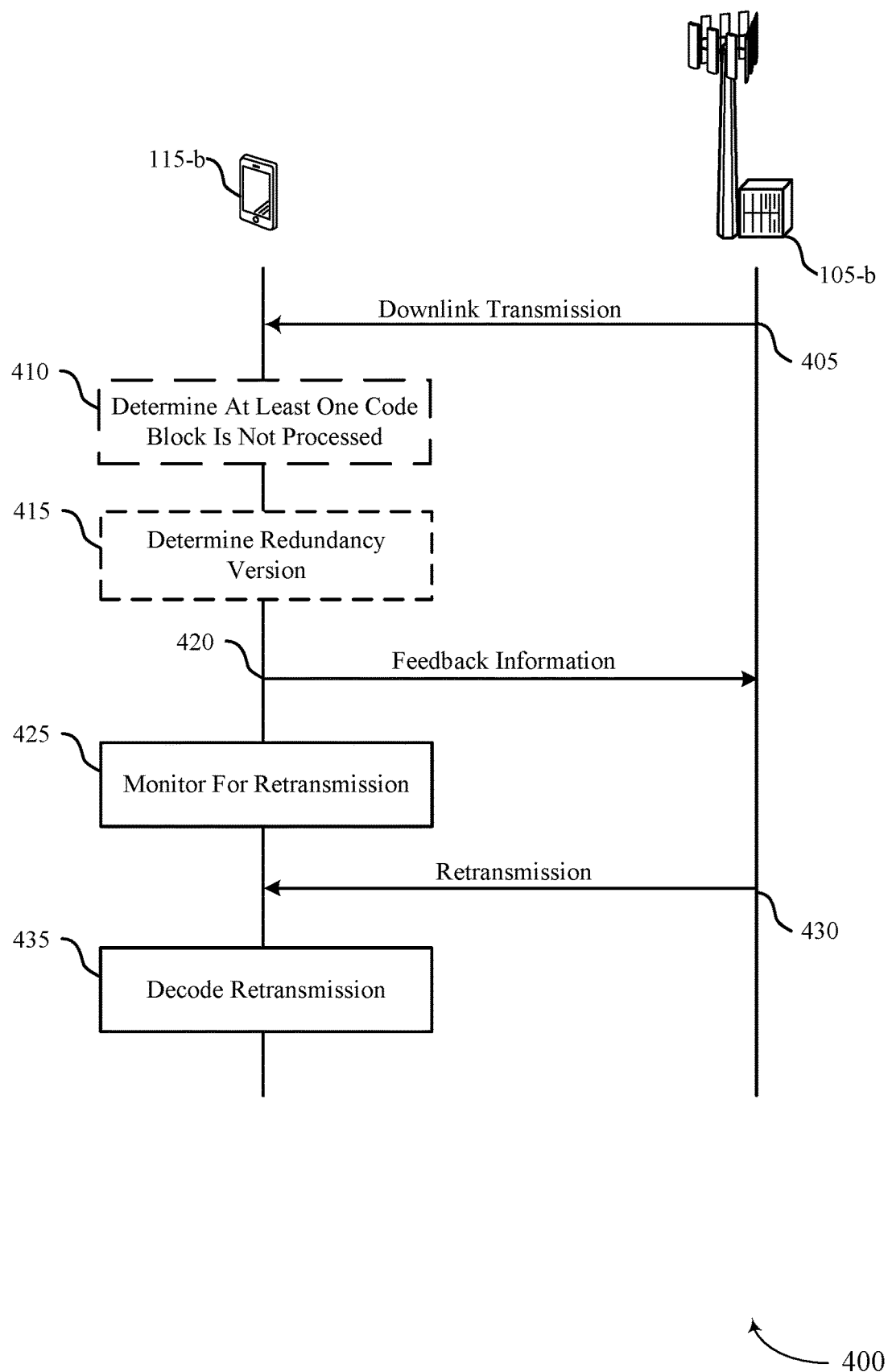
FIG. 4 illustrates an example of a process flow that supports reporting redundancy version with feedback information in accordance with aspects of the present disclosure.

FIG. 4 illustrates an example of a process flow 400 that supports reporting redundancy version with feedback information in accordance with aspects of the present disclosure. In some examples, the process flow 400 may implement aspects of wireless communications system 100 and the wireless communications system 200 described with reference to FIGS. 1 and 2, respectively. For example, the process flow 400 may be implemented by a base station 105-b and a UE 115-b, for reduced power consumption, improved efficiency, and may promote low latency for wireless communications, among other benefits. The base station 105-b and the UE 115-b may be examples of a base station 105 and a UE 115, as described with reference to FIGS. 1 through 3.

In the following description of the process flow 400, the operations between the base station 105-b and the UE 115-b may be transmitted in a different order than the example order shown, or the operations performed by the base station 105-b and the UE 115-b may be performed in different orders or at different times. Some operations may also be omitted from the process flow 400, and other operations may be added to the process flow 400.

At 405, a UE 115-b may receive a downlink transmission from a base station 105-b. The downlink transmission may be associated with at least one code block group. In some examples, a code block group may include multiple code blocks.

At 410, the UE 115-b may optionally determine that at least one of the code blocks in the downlink transmission is not processed. In some cases, the UE 115-b may determine that the downlink transmission associated with a code block group is scheduled for a set of time periods and the UE 115-b may refrain from processing the downlink transmission on at least one time period of the set of time periods. Additionally or alternatively, the UE 115-b may estimate that reception of an upcoming transport block associated with a code block group will fail.

At 415, the UE 115-b may optionally determine the redundancy version for the retransmission of a code block group including the unprocessed code block. In some cases, the UE 115-b may determine the redundancy version for the retransmission of the code block group based on refraining to process at least one time period at 410. In some cases, the UE 115-b may determine the redundancy version for the retransmission of the code block group based on the estimated failure at 410. Further, the UE 115-b and the base station 105-b may support four or more than four redundancy versions.

At 420, the UE 115-b may transmit, to the base station 105-b, feedback information corresponding to the code block group including the unprocessed code block in conjunction with an indication of a redundancy version for a retransmission of the code block group. The indication of the redundancy version may be based on the one or more unprocessed code blocks and the redundancy version determined at 415. In some cases, the UE 115-b may transmit the indication of the redundancy version via uplink control information. In some other cases, the UE 115-b may transmit a negative acknowledgement message including the indication of the redundancy version. The negative acknowledgement message may include a set of bits indicating a starting position of a low-density parity-check code base graph.

At 425, the UE 115-b may monitor for retransmission of the code block group based on the indication of the redundancy version for the retransmission of the code block group transmitted at 420.

At 430, the base station 105-b may transmit a retransmission of the code block group based on the indication of the redundancy version for the retransmission of the code block group. At 435, the UE 115-b may decode the retransmission of the code block group based on the monitoring and the redundancy version for the retransmission of the code block group.

Figure 5:
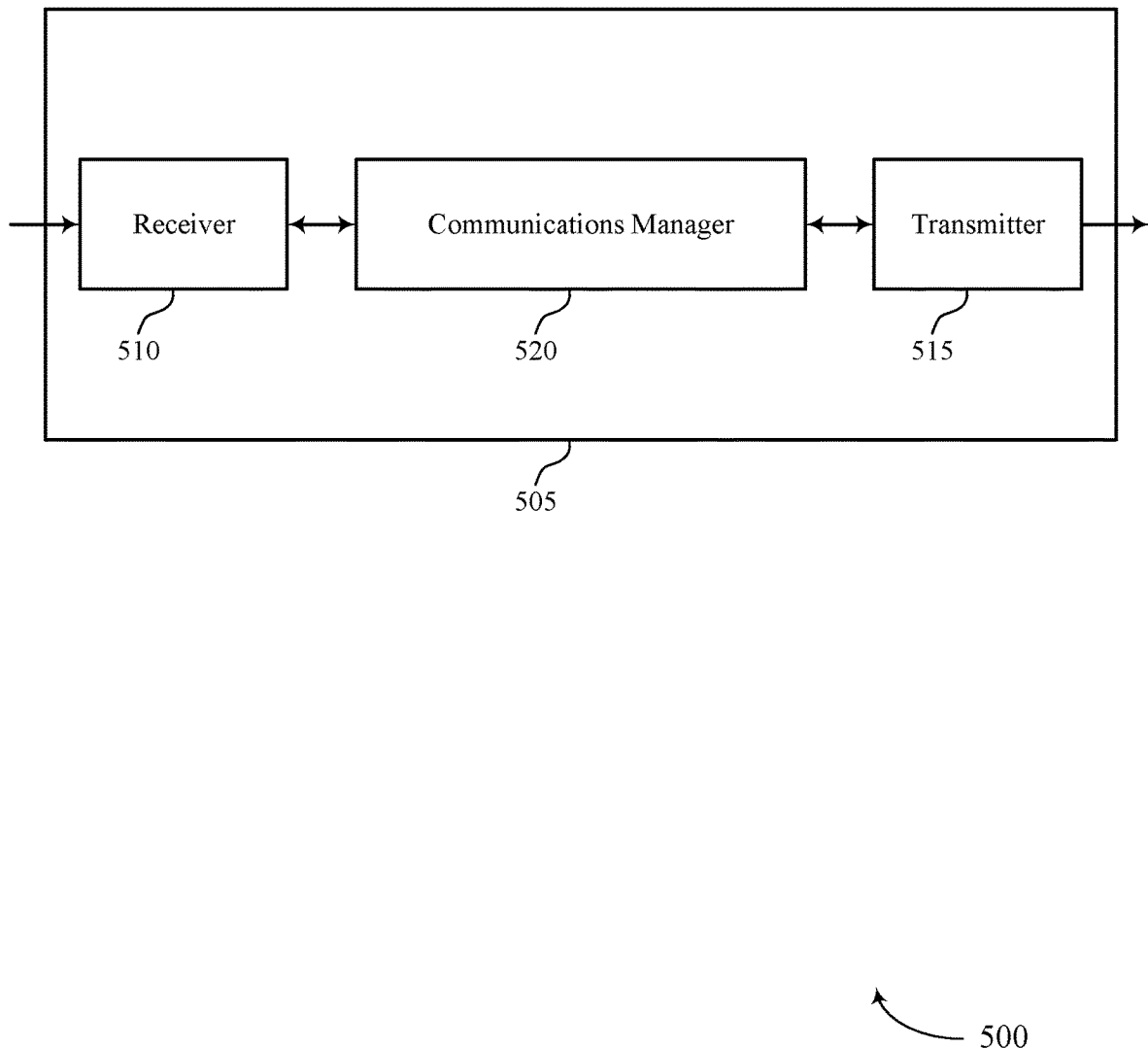
FIGS. 5 and 6 show block diagrams of devices that support reporting redundancy version with feedback information in accordance with aspects of the present disclosure.

FIG. 5 shows a block diagram 500 of a device 505 that supports reporting redundancy version with feedback information in accordance with aspects of the present disclosure. The device 505 may be an example of aspects of a UE 115 as described herein. The device 505 may include a receiver 510, a transmitter 515, and a communications manager 520. The device 505 may also include a processor. Each of these components may be in communication with one another (e.g., via one or more buses).

The receiver 510 may provide a means for receiving information such as packets, user data, control information, or any combination thereof associated with various information channels (e.g., control channels, data channels, information channels related to reporting redundancy version with feedback information). Information may be passed on to other components of the device 505. The receiver 510 may utilize a single antenna or a set of multiple antennas.

The transmitter 515 may provide a means for transmitting signals generated by other components of the device 505. For example, the transmitter 515 may transmit information such as packets, user data, control information, or any combination thereof associated with various information channels (e.g., control channels, data channels, information channels related to reporting redundancy version with feedback information). In some examples, the transmitter 515 may be co-located with a receiver 510 in a transceiver module. The transmitter 515 may utilize a single antenna or a set of multiple antennas.

The communications manager 520, the receiver 510, the transmitter 515, or various combinations thereof or various components thereof may be examples of means for performing various aspects of reporting redundancy version with feedback information as described herein. For example, the communications manager 520, the receiver 510, the transmitter 515, or various combinations or components thereof may support a method for performing one or more of the functions described herein.

In some examples, the communications manager 520, the receiver 510, the transmitter 515, or various combinations or components thereof may be implemented in hardware (e.g., in communications management circuitry). The hardware may include a processor, a digital signal processor (DSP), an application-specific integrated circuit (ASIC), a field-programmable gate array (FPGA) or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 520, the receiver 510, the transmitter 515, or various combinations or components thereof may be implemented in code (e.g., as communications management software or firmware) executed by a processor. If implemented in code executed by a processor, the functions of the communications manager 520, the receiver 510, the transmitter 515, or various combinations or components thereof may be performed by a general-purpose processor, a DSP, a central processing unit (CPU), an ASIC, an FPGA, or any combination of these or other programmable logic devices (e.g., configured as or otherwise supporting a means for performing the functions described in the present disclosure).

In some examples, the communications manager 520 may be configured to perform various operations (e.g., receiving, monitoring, transmitting) using or otherwise in cooperation with the receiver 510, the transmitter 515, or both. For example, the communications manager 520 may receive information from the receiver 510, send information to the transmitter 515, or be integrated in combination with the receiver 510, the transmitter 515, or both to receive information, transmit information, or perform various other operations as described herein.

The communications manager 520 may support wireless communication at UE in accordance with examples as disclosed herein. For example, the communications manager 520 may be configured as or otherwise support a means for transmitting, to a base station, feedback information corresponding to a code block group in conjunction with an indication of a redundancy version for a retransmission of the code block group. The communications manager 520 may be configured as or otherwise support a means for monitoring for the retransmission of the code block group based on transmitting the indication of the redundancy version for the retransmission of the code block group. The communications manager 520 may be configured as or otherwise support a means for decoding the retransmission of the code block group in accordance with the monitoring and the redundancy version for the retransmission of the code block group.

By including or configuring the communications manager 520 in accordance with examples as described herein, the device 505 (e.g., a processor controlling or otherwise coupled to the receiver 510, the transmitter 515, the communications manager 520, or a combination thereof) may support techniques for reduced processing, reduced power consumption, and more efficient utilization of communication resources.

Figure 6:
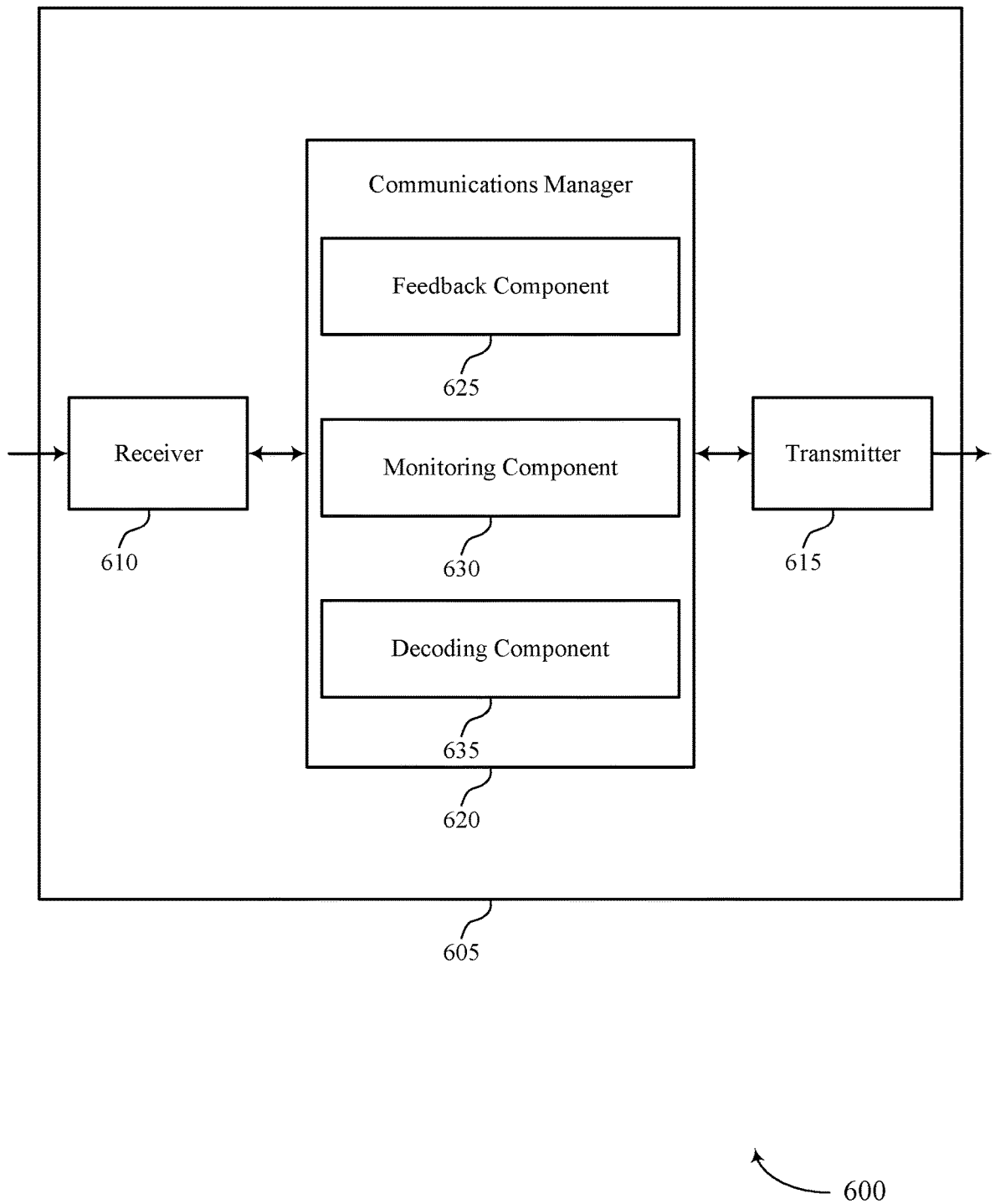

FIG. 6 shows a block diagram 600 of a device 605 that supports reporting redundancy version with feedback information in accordance with aspects of the present disclosure. The device 605 may be an example of aspects of a device 505 or a UE 115 as described herein. The device 605 may include a receiver 610, a transmitter 615, and a communications manager 620. The device 605 may also include a processor. Each of these components may be in communication with one another (e.g., via one or more buses).

The receiver 610 may provide a means for receiving information such as packets, user data, control information, or any combination thereof associated with various information channels (e.g., control channels, data channels, information channels related to reporting redundancy version with feedback information). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to reporting redundancy version with feedback information). In some examples, the transmitter 615 may be co-located with a receiver 610 in a transceiver module. The transmitter 615 may utilize a single antenna or a set of multiple antennas.

The device 605, or various components thereof, may be an example of means for performing various aspects of reporting redundancy version with feedback information as described herein. For example, the communications manager 620 may include a feedback component 625, a monitoring component 630, a decoding component 635, or any combination thereof. The communications manager 620 may be an example of aspects of a communications manager 520 as described herein. In some examples, the communications manager 620, or various components thereof, may be configured to perform various operations (e.g., receiving, monitoring, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to receive information, transmit information, or perform various other operations as described herein.

The communications manager 620 may support wireless communication at UE in accordance with examples as disclosed herein. The feedback component 625 may be configured as or otherwise support a means for transmitting, to a base station, feedback information corresponding to a code block group in conjunction with an indication of a redundancy version for a retransmission of the code block group. The monitoring component 630 may be configured as or otherwise support a means for monitoring for the retransmission of the code block group based on transmitting the indication of the redundancy version for the retransmission of the code block group. The decoding component 635 may be configured as or otherwise support a means for decoding the retransmission of the code block group in accordance with the monitoring and the redundancy version for the retransmission of the code block group.

Figure 7:
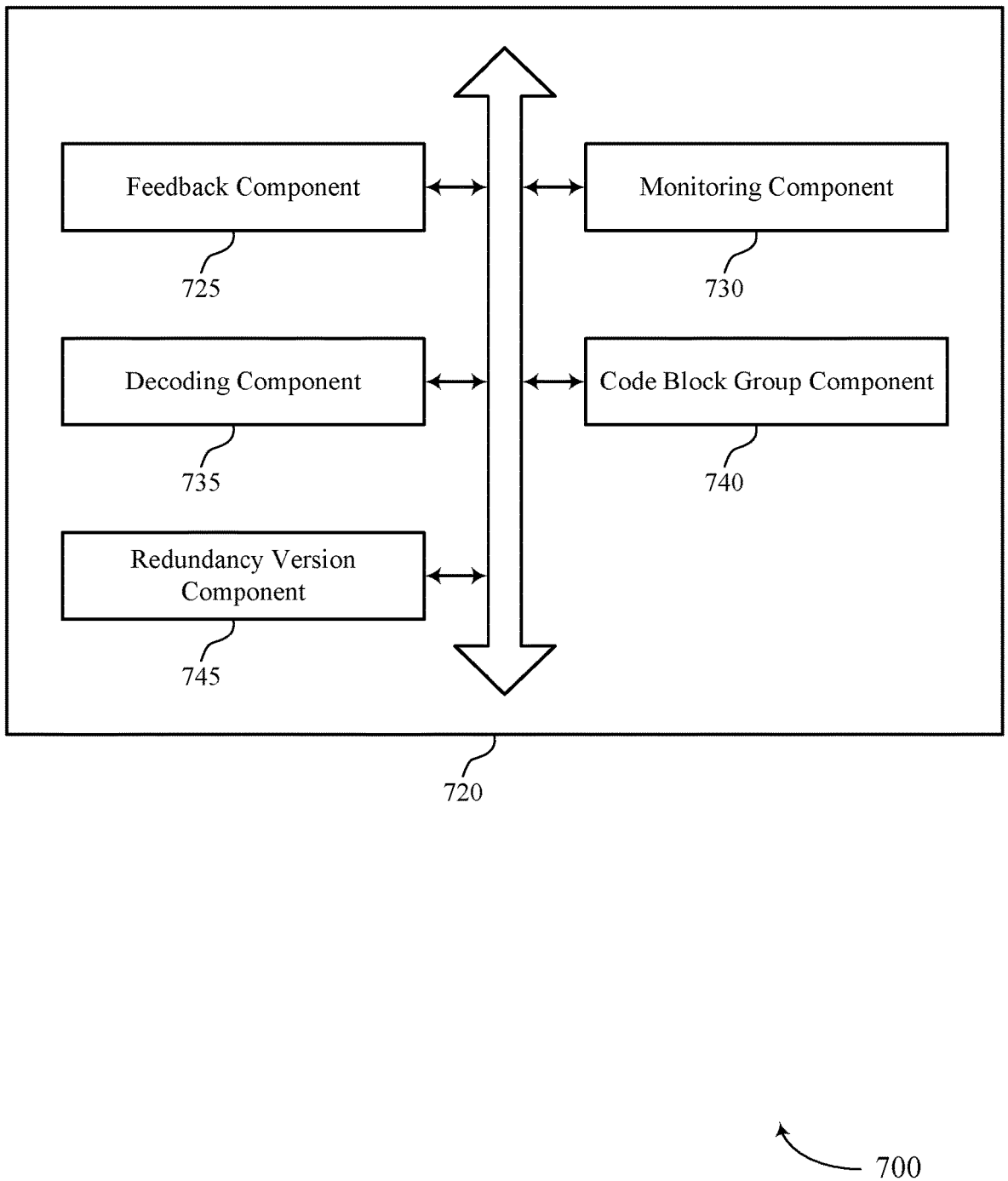
FIG. 7 shows a block diagram of a communications manager that supports reporting redundancy version with feedback information in accordance with aspects of the present disclosure.

FIG. 7 shows a block diagram 700 of a communications manager 720 that supports reporting redundancy version with feedback information in accordance with aspects of the present disclosure. The communications manager 720 may be an example of aspects of a communications manager 520, a communications manager 620, or both, as described herein. The communications manager 720, or various components thereof, may be an example of means for performing various aspects of reporting redundancy version with feedback information as described herein. For example, the communications manager 720 may include a feedback component 725, a monitoring component 730, a decoding component 735, a code block group component 740, a redundancy version component 745, or any combination thereof. Each of these components may communicate, directly or indirectly, with one another (e.g., via one or more buses).

The communications manager 720 may support wireless communication at UE in accordance with examples as disclosed herein. The feedback component 725 may be configured as or otherwise support a means for transmitting, to a base station, feedback information corresponding to a code block group in conjunction with an indication of a redundancy version for a retransmission of the code block group. The monitoring component 730 may be configured as or otherwise support a means for monitoring for the retransmission of the code block group based on transmitting the indication of the redundancy version for the retransmission of the code block group. The decoding component 735 may be configured as or otherwise support a means for decoding the retransmission of the code block group in accordance with the monitoring and the redundancy version for the retransmission of the code block group.

In some examples, the code block group component 740 may be configured as or otherwise support a means for receiving, from a base station, a downlink transmission associated with the code block group including a set of multiple code blocks. In some examples, the code block group component 740 may be configured as or otherwise support a means for determining that at least one code block of the set of multiple code blocks is not processed at the UE, where transmitting the indication of the redundancy version for the retransmission of the code block group is based on the determining.

In some examples, the redundancy version component 745 may be configured as or otherwise support a means for determining the redundancy version for the retransmission of the code block group based on an incremental redundancy buffer status, where transmitting the indication of the redundancy version for the retransmission of the code block group includes transmitting the indication of the determined redundancy version.

In some examples, the code block group component 740 may be configured as or otherwise support a means for determining that a downlink transmission associated with the code block group is scheduled for a set of time periods. In some examples, the decoding component 735 may be configured as or otherwise support a means for refraining from processing the downlink transmission on at least one time period of the set of time periods. In some examples, the redundancy version component 745 may be configured as or otherwise support a means for determining the redundancy version for the retransmission of the code block group based on the refraining.

In some examples, the code block group component 740 may be configured as or otherwise support a means for estimating failure of an upcoming reception of a transport block associated with the code block group. In some examples, the redundancy version component 745 may be configured as or otherwise support a means for determining the redundancy version for the retransmission of the code block group based on the estimating.

In some examples, to support transmitting the indication of the redundancy version, the redundancy version component 745 may be configured as or otherwise support a means for transmitting, via uplink control information, the indication of the redundancy version for the retransmission of the code block group.

In some examples, to support transmitting the indication of the redundancy version, the feedback component 725 may be configured as or otherwise support a means for transmitting a negative acknowledgement message including the indication of the redundancy version for the retransmission of the code block group. In some examples, the negative acknowledgement message includes a set of bits indicating a starting position in a low-density parity-check code base graph. In some examples, the UE and the base station support four or more than four redundancy versions.

Figure 8:
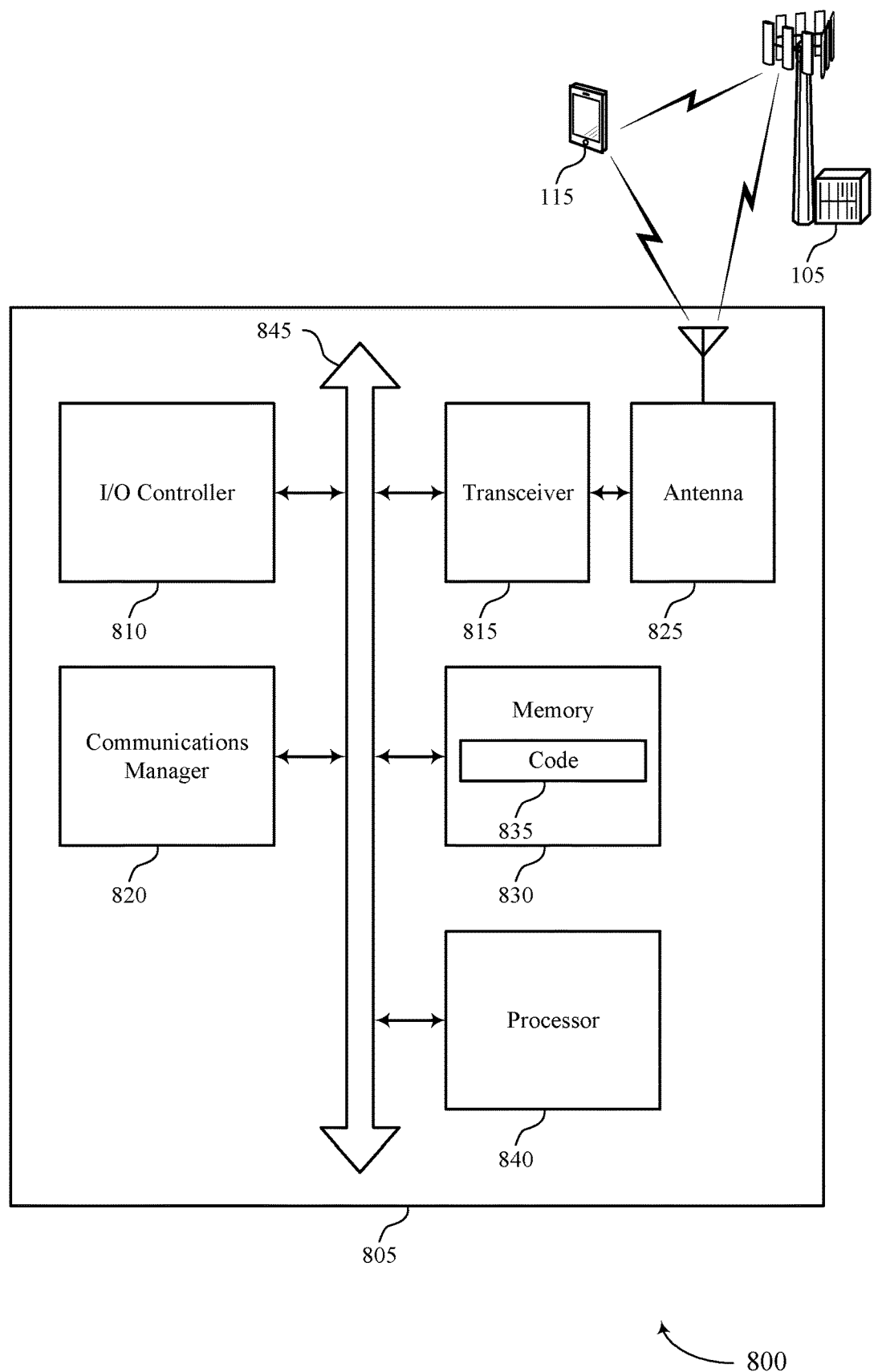
FIG. 8 shows a diagram of a system including a device that supports reporting redundancy version with feedback information in accordance with aspects of the present disclosure.

FIG. 8 shows a diagram of a system 800 including a device 805 that supports reporting redundancy version with feedback information in accordance with aspects of the present disclosure. The device 805 may be an example of or include the components of a device 505, a device 605, or a UE 115 as described herein. The device 805 may communicate wirelessly with one or more base stations 105, UEs 115, or any combination thereof. The device 805 may include components for bi-directional voice and data communications including components for transmitting and receiving communications, such as a communications manager 820, an input/output (I/O) controller 810, a transceiver 815, an antenna 825, a memory 830, code 835, and a processor 840. These components may be in electronic communication or otherwise coupled (e.g., operatively, communicatively, functionally, electronically, electrically) via one or more buses (e.g., a bus 845).

The I/O controller 810 may manage input and output signals for the device 805. The I/O controller 810 may also manage peripherals not integrated into the device 805. In some cases, the I/O controller 810 may represent a physical connection or port to an external peripheral. In some cases, the I/O controller 810 may utilize an operating system such as iOS®, ANDROID®, MS-DOS®, MS-WINDOWS®, OS/2®, UNIX®, LINUX®, or another known operating system. Additionally or alternatively, the I/O controller 810 may represent or interact with a modem, a keyboard, a mouse, a touchscreen, or a similar device. In some cases, the I/O controller 810 may be implemented as part of a processor, such as the processor 840. In some cases, a user may interact with the device 805 via the I/O controller 810 or via hardware components controlled by the I/O controller 810.

In some cases, the device 805 may include a single antenna 825. However, in some other cases, the device 805 may have more than one antenna 825, which may be capable of concurrently transmitting or receiving multiple wireless transmissions. The transceiver 815 may communicate bi-directionally, via the one or more antennas 825, wired, or wireless links as described herein. For example, the transceiver 815 may represent a wireless transceiver and may communicate bi-directionally with another wireless transceiver. The transceiver 815 may also include a modem to modulate the packets, to provide the modulated packets to one or more antennas 825 for transmission, and to demodulate packets received from the one or more antennas 825. The transceiver 815, or the transceiver 815 and one or more antennas 825, may be an example of a transmitter 515, a transmitter 615, a receiver 510, a receiver 610, or any combination thereof or component thereof, as described herein.

The memory 830 may include random access memory (RAM) and read-only memory (ROM). The memory 830 may store computer-readable, computer-executable code 835 including instructions that, when executed by the processor 840, cause the device 805 to perform various functions described herein. The code 835 may be stored in a non-transitory computer-readable medium such as system memory or another type of memory. In some cases, the code 835 may not be directly executable by the processor 840 but may cause a computer (e.g., when compiled and executed) to perform functions described herein. In some cases, the memory 830 may contain, among other things, a basic I/O system (BIOS) which may control basic hardware or software operation such as the interaction with peripheral components or devices.

The processor 840 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 840 may be configured to operate a memory array using a memory controller. In some other cases, a memory controller may be integrated into the processor 840. The processor 840 may be configured to execute computer-readable instructions stored in a memory (e.g., the memory 830) to cause the device 805 to perform various functions (e.g., functions or tasks supporting reporting redundancy version with feedback information). For example, the device 805 or a component of the device 805 may include a processor 840 and memory 830 coupled to the processor 840, the processor 840 and memory 830 configured to perform various functions described herein.

The communications manager 820 may support wireless communication at UE in accordance with examples as disclosed herein. For example, the communications manager 820 may be configured as or otherwise support a means for transmitting, to a base station, feedback information corresponding to a code block group in conjunction with an indication of a redundancy version for a retransmission of the code block group. The communications manager 820 may be configured as or otherwise support a means for monitoring for the retransmission of the code block group based on transmitting the indication of the redundancy version for the retransmission of the code block group. The communications manager 820 may be configured as or otherwise support a means for decoding the retransmission of the code block group in accordance with the monitoring and the redundancy version for the retransmission of the code block group.

By including or configuring the communications manager 820 in accordance with examples as described herein, the device 805 may support techniques for improved communication reliability, reduced latency, improved user experience related to reduced processing, reduced power consumption, and more efficient utilization of communication resources.

In some examples, the communications manager 820 may be configured to perform various operations (e.g., receiving, monitoring, transmitting) using or otherwise in cooperation with the transceiver 815, the one or more antennas 825, or any combination thereof. Although the communications manager 820 is illustrated as a separate component, in some examples, one or more functions described with reference to the communications manager 820 may be supported by or performed by the processor 840, the memory 830, the code 835, or any combination thereof. For example, the code 835 may include instructions executable by the processor 840 to cause the device 805 to perform various aspects of reporting redundancy version with feedback information as described herein, or the processor 840 and the memory 830 may be otherwise configured to perform or support such operations.

Figure 9:
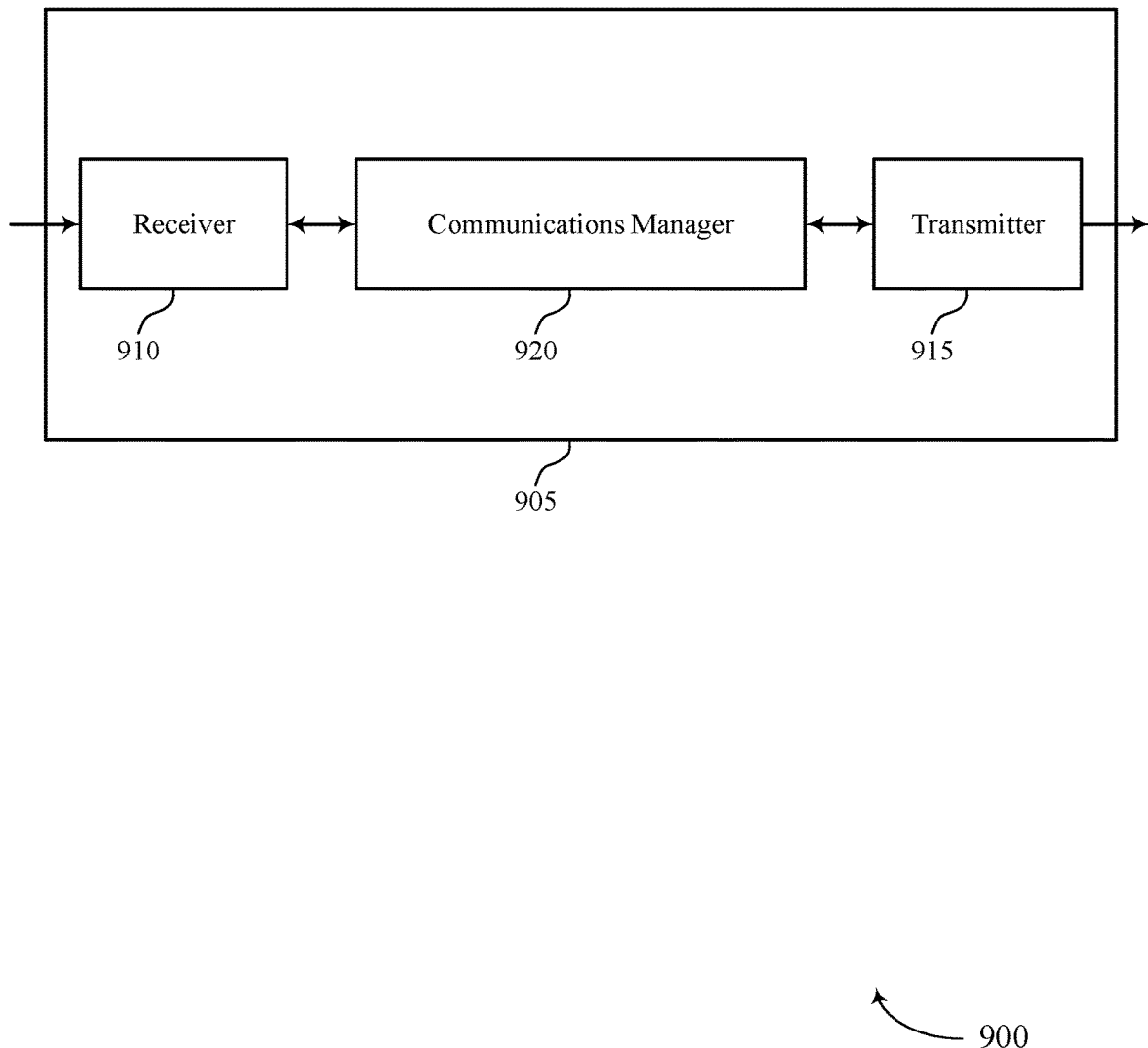
FIGS. 9 and 10 show block diagrams of devices that support reporting redundancy version with feedback information in accordance with aspects of the present disclosure.

FIG. 9 shows a block diagram 900 of a device 905 that supports reporting redundancy version with feedback information in accordance with aspects of the present disclosure. The device 905 may be an example of aspects of a base station 105 as described herein. The device 905 may include a receiver 910, a transmitter 915, and a communications manager 920. The device 905 may also include a processor. Each of these components may be in communication with one another (e.g., via one or more buses).

The receiver 910 may provide a means for receiving information such as packets, user data, control information, or any combination thereof associated with various information channels (e.g., control channels, data channels, information channels related to reporting redundancy version with feedback information). Information may be passed on to other components of the device 905. The receiver 910 may utilize a single antenna or a set of multiple antennas.

The transmitter 915 may provide a means for transmitting signals generated by other components of the device 905. For example, the transmitter 915 may transmit information such as packets, user data, control information, or any combination thereof associated with various information channels (e.g., control channels, data channels, information channels related to reporting redundancy version with feedback information). In some examples, the transmitter 915 may be co-located with a receiver 910 in a transceiver module. The transmitter 915 may utilize a single antenna or a set of multiple antennas.

The communications manager 920, the receiver 910, the transmitter 915, or various combinations thereof or various components thereof may be examples of means for performing various aspects of reporting redundancy version with feedback information as described herein. For example, the communications manager 920, the receiver 910, the transmitter 915, or various combinations or components thereof may support a method for performing one or more of the functions described herein.

In some examples, the communications manager 920, the receiver 910, the transmitter 915, or various combinations or components thereof may be implemented in hardware (e.g., in communications management circuitry). The hardware may include a processor, a DSP, an ASIC, an FPGA or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 920, the receiver 910, the transmitter 915, or various combinations or components thereof may be implemented in code (e.g., as communications management software or firmware) executed by a processor. If implemented in code executed by a processor, the functions of the communications manager 920, the receiver 910, the transmitter 915, or various combinations or components thereof may be performed by a general-purpose processor, a DSP, a CPU, an ASIC, an FPGA, or any combination of these or other programmable logic devices (e.g., configured as or otherwise supporting a means for performing the functions described in the present disclosure).

In some examples, the communications manager 920 may be configured to perform various operations (e.g., receiving, monitoring, transmitting) using or otherwise in cooperation with the receiver 910, the transmitter 915, or both. For example, the communications manager 920 may receive information from the receiver 910, send information to the transmitter 915, or be integrated in combination with the receiver 910, the transmitter 915, or both to receive information, transmit information, or perform various other operations as described herein.

The communications manager 920 may support wireless communication at a base station in accordance with examples as disclosed herein. For example, the communications manager 920 may be configured as or otherwise support a means for receiving, from a UE, feedback information corresponding to a code block group in conjunction with an indication of a redundancy version for a retransmission of the code block group. The communications manager 920 may be configured as or otherwise support a means for transmitting, to the UE, the retransmission of the code block group based on receiving the indication of the redundancy version for the retransmission of the code block group.

By including or configuring the communications manager 920 in accordance with examples as described herein, the device 905 (e.g., a processor controlling or otherwise coupled to the receiver 910, the transmitter 915, the communications manager 920, or a combination thereof) may support techniques for reduced processing, reduced power consumption, and more efficient utilization of communication resources.

Figure 10:
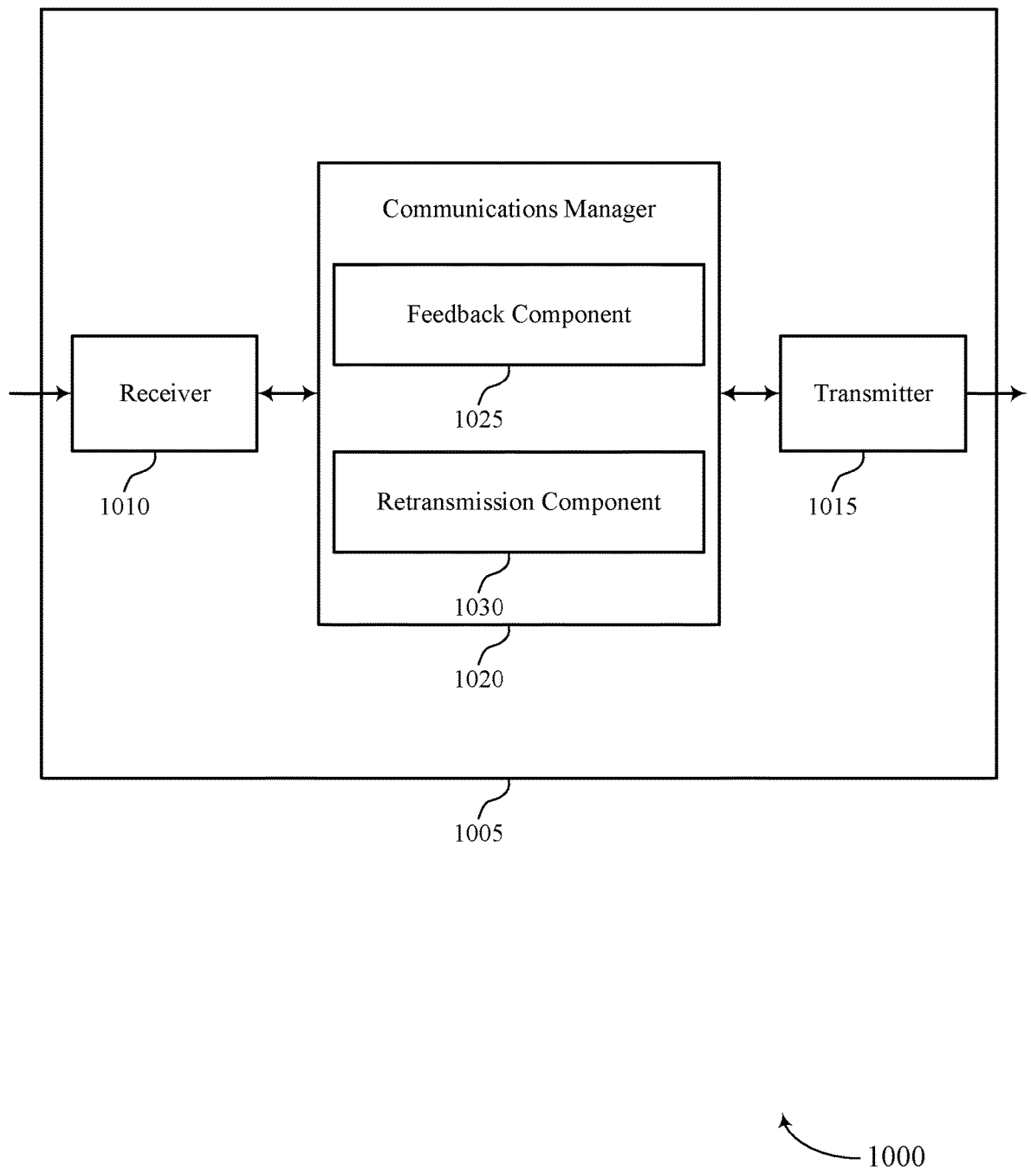

FIG. 10 shows a block diagram 1000 of a device 1005 that supports reporting redundancy version with feedback information in accordance with aspects of the present disclosure. The device 1005 may be an example of aspects of a device 905 or a base station 105 as described herein. The device 1005 may include a receiver 1010, a transmitter 1015, and a communications manager 1020. The device 1005 may also include a processor. Each of these components may be in communication with one another (e.g., via one or more buses).

The receiver 1010 may provide a means for receiving information such as packets, user data, control information, or any combination thereof associated with various information channels (e.g., control channels, data channels, information channels related to reporting redundancy version with feedback information). Information may be passed on to other components of the device 1005. The receiver 1010 may utilize a single antenna or a set of multiple antennas.

The transmitter 1015 may provide a means for transmitting signals generated by other components of the device 1005. For example, the transmitter 1015 may transmit information such as packets, user data, control information, or any combination thereof associated with various information channels (e.g., control channels, data channels, information channels related to reporting redundancy version with feedback information). In some examples, the transmitter 1015 may be co-located with a receiver 1010 in a transceiver module. The transmitter 1015 may utilize a single antenna or a set of multiple antennas.

The device 1005, or various components thereof, may be an example of means for performing various aspects of reporting redundancy version with feedback information as described herein. For example, the communications manager 1020 may include a feedback component 1025 a retransmission component 1030, or any combination thereof. The communications manager 1020 may be an example of aspects of a communications manager 920 as described herein. In some examples, the communications manager 1020, or various components thereof, may be configured to perform various operations (e.g., receiving, monitoring, transmitting) using or otherwise in cooperation with the receiver 1010, the transmitter 1015, or both. For example, the communications manager 1020 may receive information from the receiver 1010, send information to the transmitter 1015, or be integrated in combination with the receiver 1010, the transmitter 1015, or both to receive information, transmit information, or perform various other operations as described herein.

The communications manager 1020 may support wireless communication at a base station in accordance with examples as disclosed herein. The feedback component 1025 may be configured as or otherwise support a means for receiving, from a UE, feedback information corresponding to a code block group in conjunction with an indication of a redundancy version for a retransmission of the code block group. The retransmission component 1030 may be configured as or otherwise support a means for transmitting, to the UE, the retransmission of the code block group based on receiving the indication of the redundancy version for the retransmission of the code block group.

Figure 11:
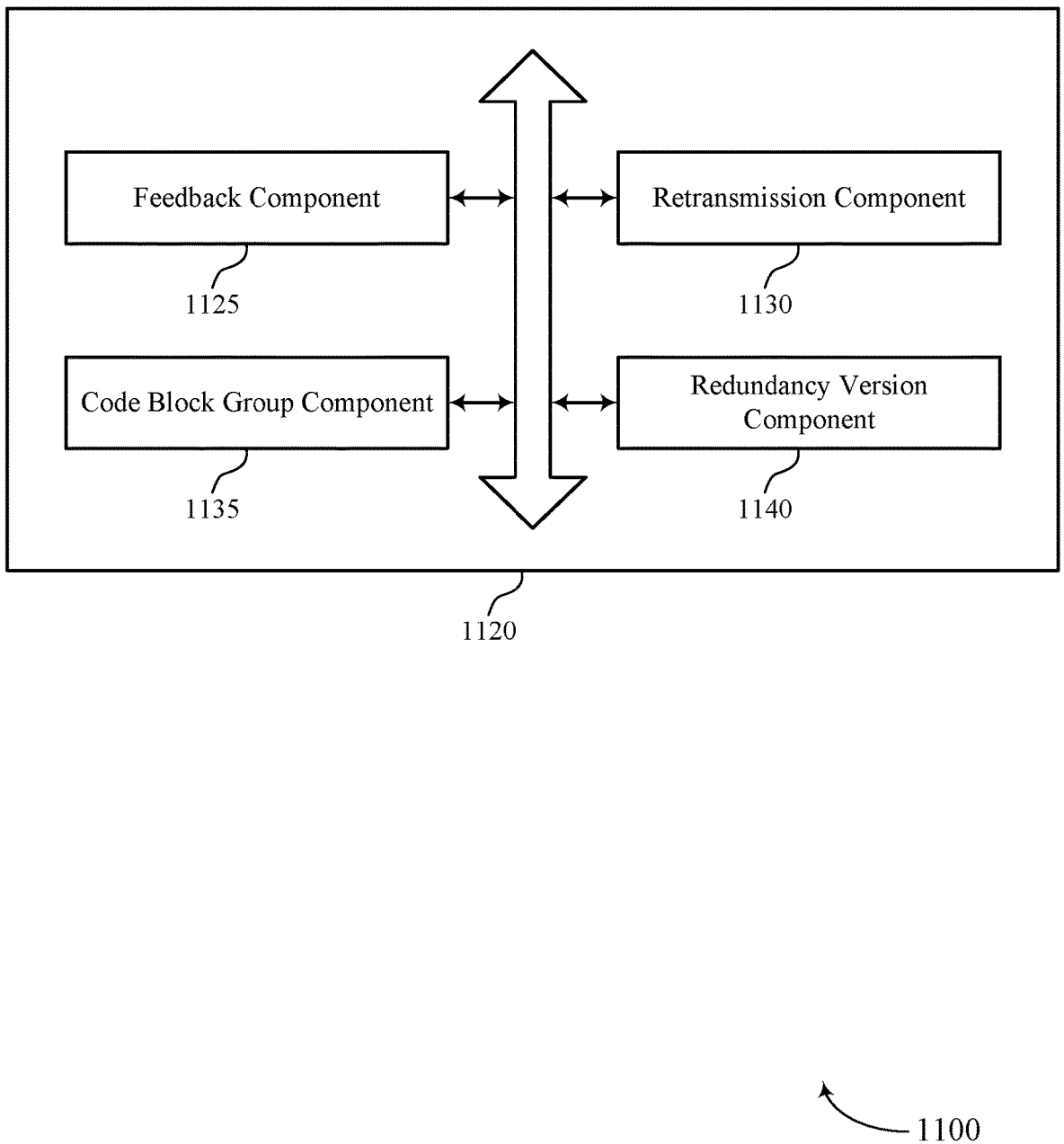
FIG. 11 shows a block diagram of a communications manager that supports reporting redundancy version with feedback information in accordance with aspects of the present disclosure.

FIG. 11 shows a block diagram 1100 of a communications manager 1120 that supports reporting redundancy version with feedback information in accordance with aspects of the present disclosure. The communications manager 1120 may be an example of aspects of a communications manager 920, a communications manager 1020, or both, as described herein. The communications manager 1120, or various components thereof, may be an example of means for performing various aspects of reporting redundancy version with feedback information as described herein. For example, the communications manager 1120 may include a feedback component 1125, a retransmission component 1130, a code block group component 1135, a redundancy version component 1140, or any combination thereof. Each of these components may communicate, directly or indirectly, with one another (e.g., via one or more buses).

The communications manager 1120 may support wireless communication at a base station in accordance with examples as disclosed herein. The feedback component 1125 may be configured as or otherwise support a means for receiving, from a UE, feedback information corresponding to a code block group in conjunction with an indication of a redundancy version for a retransmission of the code block group. The retransmission component 1130 may be configured as or otherwise support a means for transmitting, to the UE, the retransmission of the code block group based on receiving the indication of the redundancy version for the retransmission of the code block group.

In some examples, the code block group component 1135 may be configured as or otherwise support a means for transmitting, to the UE, a downlink transmission associated with the code block group including a set of multiple code blocks, where receiving the indication of the redundancy version for the retransmission of the code block group is based on at least one code block of the set of multiple code blocks not being processed at the UE.

In some examples, to support receiving the indication of the redundancy version, the redundancy version component 1140 may be configured as or otherwise support a means for receiving the indication of the redundancy version for the retransmission of the code block group based on an incremental redundancy buffer status at the UE.

In some examples, to support receiving the indication of the redundancy version, the redundancy version component 1140 may be configured as or otherwise support a means for receiving, via uplink control information, the indication of the redundancy version for the retransmission of the code block group.

In some examples, to support receiving the indication of the redundancy version, the feedback component 1125 may be configured as or otherwise support a means for receiving a negative acknowledgement message including the indication of the redundancy version for the retransmission of the code block group. In some examples, the negative acknowledgement message includes a set of bits indicating a starting position in a low-density parity-check code base graph. In some examples, the UE and the base station support four or more than four redundancy versions.

Figure 12:
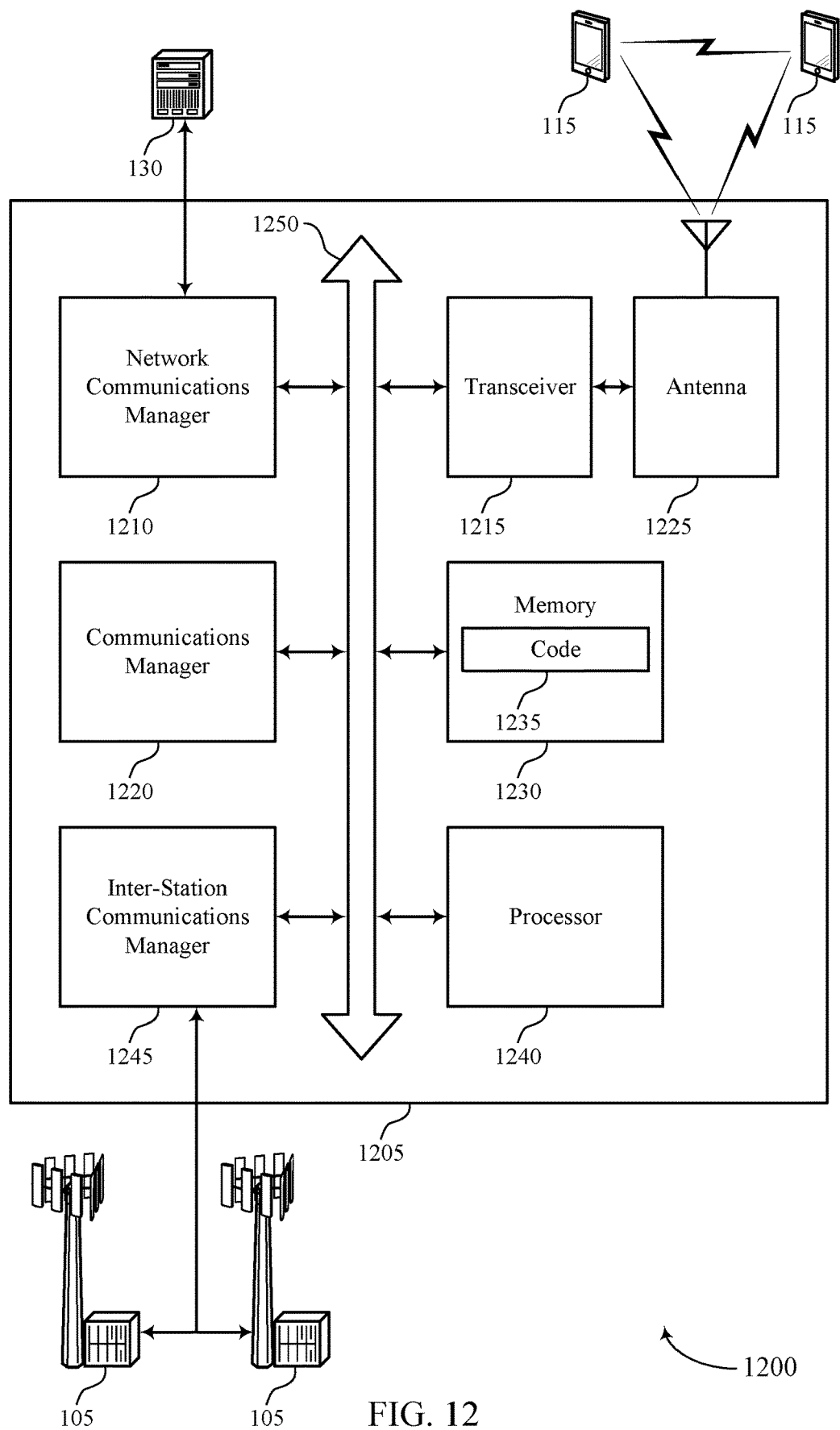
FIG. 12 shows a diagram of a system including a device that supports reporting redundancy version with feedback information in accordance with aspects of the present disclosure.

FIG. 12 shows a diagram of a system 1200 including a device 1205 that supports reporting redundancy version with feedback information in accordance with aspects of the present disclosure. The device 1205 may be an example of or include the components of a device 905, a device 1005, or a base station 105 as described herein. The device 1205 may communicate wirelessly with one or more base stations 105, UEs 115, or any combination thereof. The device 1205 may include components for bi-directional voice and data communications including components for transmitting and receiving communications, such as a communications manager 1220, a network communications manager 1210, a transceiver 1215, an antenna 1225, a memory 1230, code 1235, a processor 1240, and an inter-station communications manager 1245. These components may be in electronic communication or otherwise coupled (e.g., operatively, communicatively, functionally, electronically, electrically) via one or more buses (e.g., a bus 1250).

The network communications manager 1210 may manage communications with a core network 130 (e.g., via one or more wired backhaul links). For example, the network communications manager 1210 may manage the transfer of data communications for client devices, such as one or more UEs 115.

In some cases, the device 1205 may include a single antenna 1225. However, in some other cases the device 1205 may have more than one antenna 1225, which may be capable of concurrently transmitting or receiving multiple wireless transmissions. The transceiver 1215 may communicate bi-directionally, via the one or more antennas 1225, wired, or wireless links as described herein. For example, the transceiver 1215 may represent a wireless transceiver and may communicate bi-directionally with another wireless transceiver. The transceiver 1215 may also include a modem to modulate the packets, to provide the modulated packets to one or more antennas 1225 for transmission, and to demodulate packets received from the one or more antennas 1225. The transceiver 1215, or the transceiver 1215 and one or more antennas 1225, may be an example of a transmitter 915, a transmitter 1015, a receiver 910, a receiver 1010, or any combination thereof or component thereof, as described herein.

The memory 1230 may include RAM and ROM. The memory 1230 may store computer-readable, computer-executable code 1235 including instructions that, when executed by the processor 1240, cause the device 1205 to perform various functions described herein. The code 1235 may be stored in a non-transitory computer-readable medium such as system memory or another type of memory. In some cases, the code 1235 may not be directly executable by the processor 1240 but may cause a computer (e.g., when compiled and executed) to perform functions described herein. In some cases, the memory 1230 may contain, among other things, a BIOS which may control basic hardware or software operation such as the interaction with peripheral components or devices.

The processor 1240 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1240 may be configured to operate a memory array using a memory controller. In some other cases, a memory controller may be integrated into the processor 1240. The processor 1240 may be configured to execute computer-readable instructions stored in a memory (e.g., the memory 1230) to cause the device 1205 to perform various functions (e.g., functions or tasks supporting reporting redundancy version with feedback information). For example, the device 1205 or a component of the device 1205 may include a processor 1240 and memory 1230 coupled to the processor 1240, the processor 1240 and memory 1230 configured to perform various functions described herein.

The inter-station communications manager 1245 may manage communications with other base stations 105, and may include a controller or scheduler for controlling communications with UEs 115 in cooperation with other base stations 105. For example, the inter-station communications manager 1245 may coordinate scheduling for transmissions to UEs 115 for various interference mitigation techniques such as beamforming or joint transmission. In some examples, the inter-station communications manager 1245 may provide an X2 interface within an LTE/LTE-A wireless communications network technology to provide communication between base stations 105.

The communications manager 1220 may support wireless communication at a base station in accordance with examples as disclosed herein. For example, the communications manager 1220 may be configured as or otherwise support a means for receiving, from a UE, feedback information corresponding to a code block group in conjunction with an indication of a redundancy version for a retransmission of the code block group. The communications manager 1220 may be configured as or otherwise support a means for transmitting, to the UE, the retransmission of the code block group based on receiving the indication of the redundancy version for the retransmission of the code block group.

By including or configuring the communications manager 1220 in accordance with examples as described herein, the device 1205 may support techniques for improved communication reliability, reduced latency, improved user experience related to reduced processing, reduced power consumption, more efficient utilization of communication resources, and improved utilization of processing capability.

In some examples, the communications manager 1220 may be configured to perform various operations (e.g., receiving, monitoring, transmitting) using or otherwise in cooperation with the transceiver 1215, the one or more antennas 1225, or any combination thereof. Although the communications manager 1220 is illustrated as a separate component, in some examples, one or more functions described with reference to the communications manager 1220 may be supported by or performed by the processor 1240, the memory 1230, the code 1235, or any combination thereof. For example, the code 1235 may include instructions executable by the processor 1240 to cause the device 1205 to perform various aspects of reporting redundancy version with feedback information as described herein, or the processor 1240 and the memory 1230 may be otherwise configured to perform or support such operations.

Figure 13:
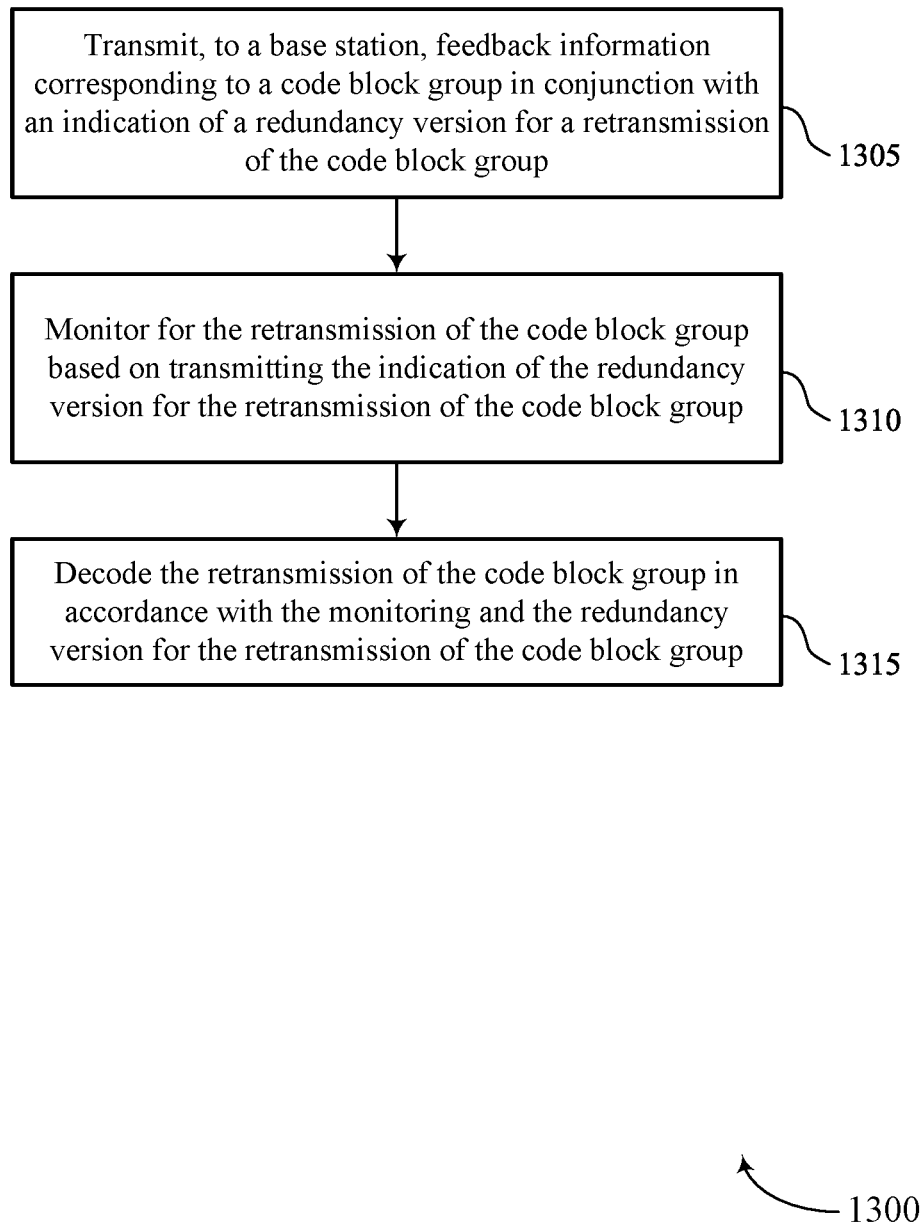
FIGS. 13 through 16 show flowcharts illustrating methods that support reporting redundancy version with feedback information in accordance with aspects of the present disclosure.

FIG. 13 shows a flowchart illustrating a method 1300 that supports reporting redundancy version with feedback information in accordance with aspects of the present disclosure.

The operations of the method 1300 may be implemented by a UE or its components as described herein. For example, the operations of the method 1300 may be performed by a UE 115 as described with reference to FIGS. 1 through 8. In some examples, a UE may execute a set of instructions to control the functional elements of the UE to perform the described functions. Additionally or alternatively, the UE may perform aspects of the described functions using special-purpose hardware.

At 1305, the method may include transmitting, to a base station, feedback information corresponding to a code block group in conjunction with an indication of a redundancy version for a retransmission of the code block group. The operations of 1305 may be performed in accordance with examples as disclosed herein. In some examples, aspects of the operations of 1305 may be performed by a feedback component 725 as described with reference to FIG. 7.

At 1310, the method may include monitoring for the retransmission of the code block group based on transmitting the indication of the redundancy version for the retransmission of the code block group. The operations of 1310 may be performed in accordance with examples as disclosed herein. In some examples, aspects of the operations of 1310 may be performed by a monitoring component 730 as described with reference to FIG. 7.

At 1315, the method may include decoding the retransmission of the code block group in accordance with the monitoring and the redundancy version for the retransmission of the code block group. The operations of 1315 may be performed in accordance with examples as disclosed herein. In some examples, aspects of the operations of 1315 may be performed by a decoding component 735 as described with reference to FIG. 7.

Figure 14:
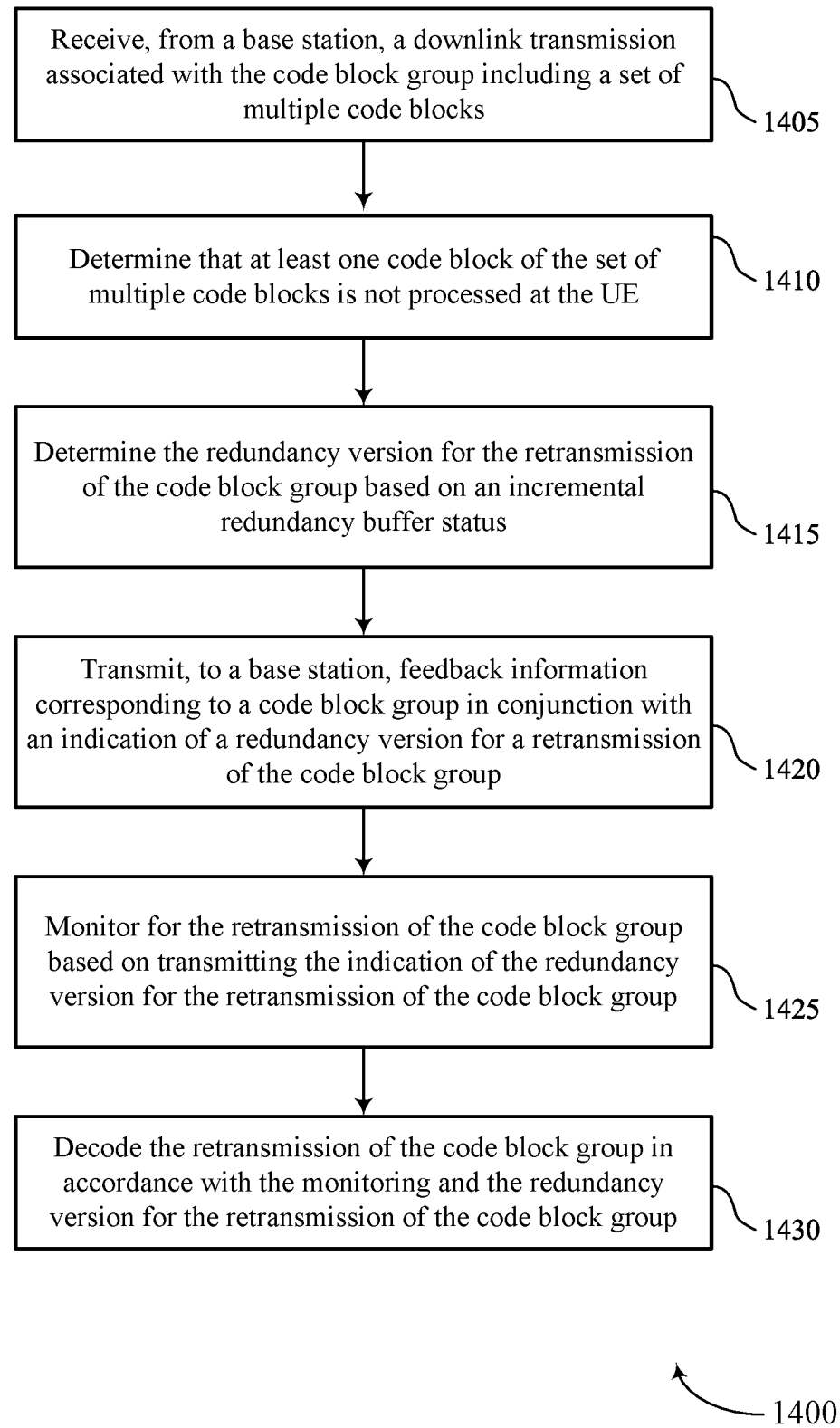

FIG. 14 shows a flowchart illustrating a method 1400 that supports reporting redundancy version with feedback information in accordance with aspects of the present disclosure. The operations of the method 1400 may be implemented by a UE or its components as described herein. For example, the operations of the method 1400 may be performed by a UE 115 as described with reference to FIGS. 1 through 8. In some examples, a UE may execute a set of instructions to control the functional elements of the UE to perform the described functions. Additionally or alternatively, the UE may perform aspects of the described functions using special-purpose hardware.

At 1405, the method may include receiving, from a base station, a downlink transmission associated with the code block group including a set of multiple code blocks. The operations of 1405 may be performed in accordance with examples as disclosed herein. In some examples, aspects of the operations of 1405 may be performed by a code block group component 740 as described with reference to FIG. 7.

At 1410, the method may include determining that at least one code block of the set of multiple code blocks is not processed at the UE. The operations of 1410 may be performed in accordance with examples as disclosed herein. In some examples, aspects of the operations of 1410 may be performed by a code block group component 740 as described with reference to FIG. 7.

At 1415, the method may include determining the redundancy version for the retransmission of the code block group based on an incremental redundancy buffer status. The operations of 1415 may be performed in accordance with examples as disclosed herein. In some examples, aspects of the operations of 1415 may be performed by a redundancy version component 745 as described with reference to FIG. 7.

At 1420, the method may include transmitting, to a base station, feedback information corresponding to a code block group in conjunction with an indication of a redundancy version for a retransmission of the code block group. In some examples, transmitting the indication of the redundancy version for the retransmission of the code block group is based on determining that the at least one code block of the set of multiple code blocks is not processed at the UE. In some examples, transmitting the indication of the redundancy version for the retransmission of the code block group includes transmitting the indication of the determined redundancy version. The operations of 1420 may be performed in accordance with examples as disclosed herein. In some examples, aspects of the operations of 1420 may be performed by a feedback component 725 as described with reference to FIG. 7.

At 1425, the method may include monitoring for the retransmission of the code block group based on transmitting the indication of the redundancy version for the retransmission of the code block group. The operations of 1425 may be performed in accordance with examples as disclosed herein. In some examples, aspects of the operations of 1425 may be performed by a monitoring component 730 as described with reference to FIG. 7.

At 1430, the method may include decoding the retransmission of the code block group in accordance with the monitoring and the redundancy version for the retransmission of the code block group. The operations of 1430 may be performed in accordance with examples as disclosed herein. In some examples, aspects of the operations of 1430 may be performed by a decoding component 735 as described with reference to FIG. 7.

Figure 15:
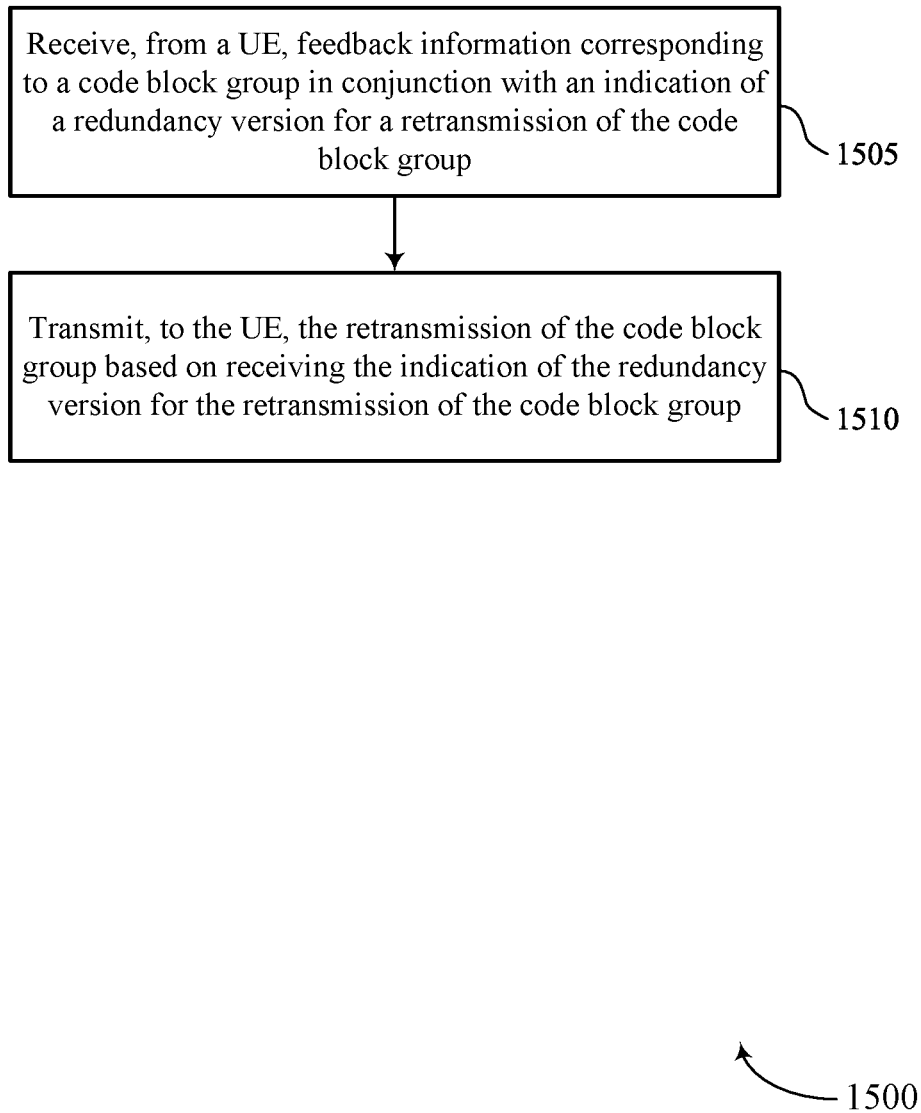

FIG. 15 shows a flowchart illustrating a method 1500 that supports reporting redundancy version with feedback information in accordance with aspects of the present disclosure. The operations of the method 1500 may be implemented by a base station or its components as described herein. For example, the operations of the method 1500 may be performed by a base station 105 as described with reference to FIGS. 1 through 4 and 9 through 12. In some examples, a base station may execute a set of instructions to control the functional elements of the base station to perform the described functions. Additionally or alternatively, the base station may perform aspects of the described functions using special-purpose hardware.

At 1505, the method may include receiving, from a UE, feedback information corresponding to a code block group in conjunction with an indication of a redundancy version for a retransmission of the code block group. The operations of 1505 may be performed in accordance with examples as disclosed herein. In some examples, aspects of the operations of 1505 may be performed by a feedback component 1125 as described with reference to FIG. 11.

At 1510, the method may include transmitting, to the UE, the retransmission of the code block group based on receiving the indication of the redundancy version for the retransmission of the code block group. The operations of 1510 may be performed in accordance with examples as disclosed herein. In some examples, aspects of the operations of 1510 may be performed by a retransmission component 1130 as described with reference to FIG. 11.

Figure 16:
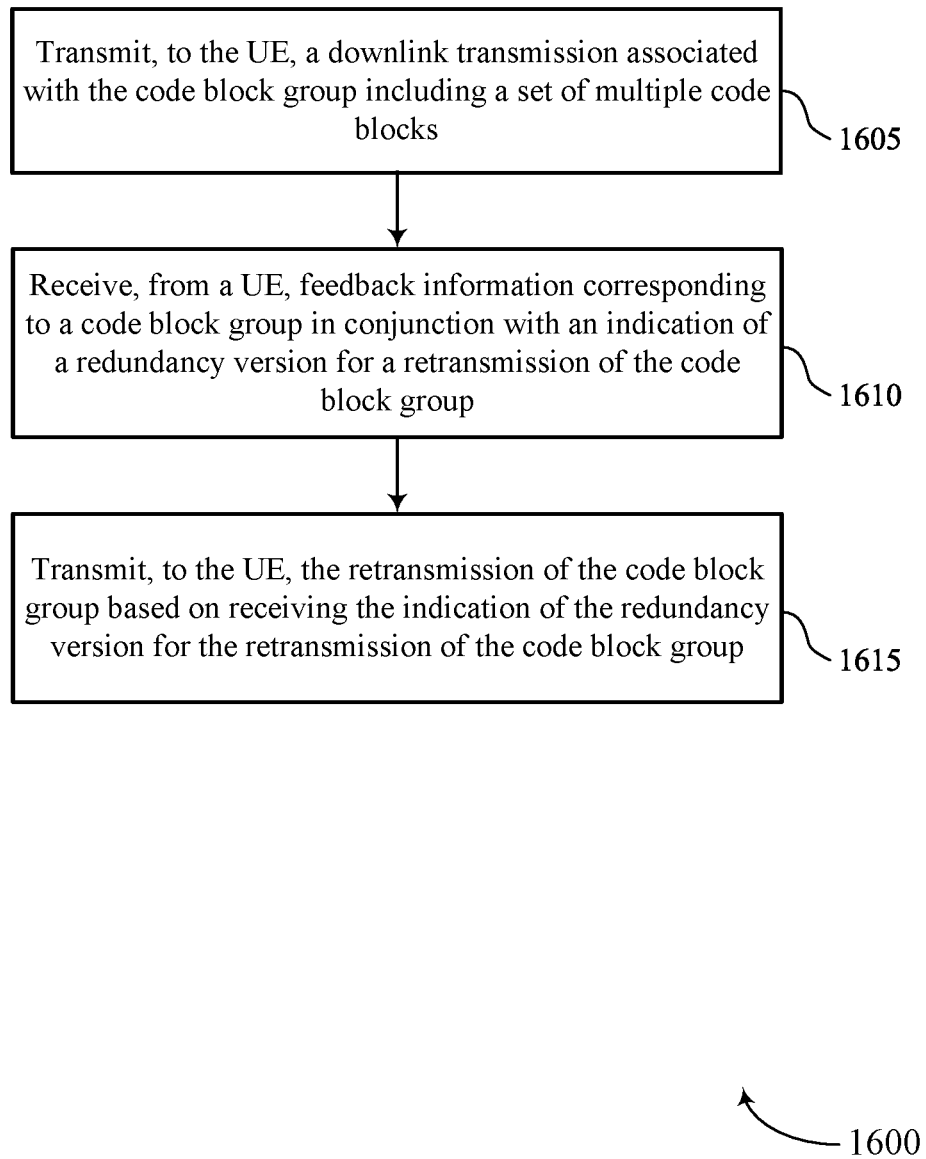

FIG. 16 shows a flowchart illustrating a method 1600 that supports reporting redundancy version with feedback information in accordance with aspects of the present disclosure. The operations of the method 1600 may be implemented by a base station or its components as described herein. For example, the operations of the method 1600 may be performed by a base station 105 as described with reference to FIGS. 1 through 4 and 9 through 12. In some examples, a base station may execute a set of instructions to control the functional elements of the base station to perform the described functions. Additionally or alternatively, the base station may perform aspects of the described functions using special-purpose hardware.

At 1605, the method may include transmitting, to the UE, a downlink transmission associated with the code block group including a set of multiple code blocks. The operations of 1605 may be performed in accordance with examples as disclosed herein. In some examples, aspects of the operations of 1605 may be performed by a code block group component 1135 as described with reference to FIG. 11.

At 1610, the method may include receiving, from a UE, feedback information corresponding to a code block group in conjunction with an indication of a redundancy version for a retransmission of the code block group. In some examples, receiving the indication of the redundancy version for the retransmission of the code block group is based on at least one code block of the set of multiple code blocks not being processed at the UE. The operations of 1610 may be performed in accordance with examples as disclosed herein. In some examples, aspects of the operations of 1610 may be performed by a feedback component 1125 as described with reference to FIG. 11.

At 1615, the method may include transmitting, to the UE, the retransmission of the code block group based on receiving the indication of the redundancy version for the retransmission of the code block group. The operations of 1615 may be performed in accordance with examples as disclosed herein. In some examples, aspects of the operations of 1615 may be performed by a retransmission component 1130 as described with reference to FIG. 11.

The following provides an overview of aspects of the present disclosure:

Aspect 1: A method for wireless communication at UE, comprising: transmitting, to a base station, feedback information corresponding to a code block group in conjunction with an indication of a redundancy version for a retransmission of the code block group; monitoring for the retransmission of the code block group based at least in part on transmitting the indication of the redundancy version for the retransmission of the code block group; and decoding the retransmission of the code block group in accordance with the monitoring and the redundancy version for the retransmission of the code block group.

Aspect 2: The method of aspect 1, further comprising: receiving, from the base station, a downlink transmission associated with the code block group comprising a plurality of code blocks; and determining that at least one code block of the plurality of code blocks is not processed at the UE, wherein transmitting the indication of the redundancy version for the retransmission of the code block group is based at least in part on the determining.

Aspect 3: The method of any of aspects 1 through 2, further comprising: determining the redundancy version for the retransmission of the code block group based at least in part on an incremental redundancy buffer status, wherein transmitting the indication of the redundancy version for the retransmission of the code block group comprises transmitting the indication of the determined redundancy version.

Aspect 4: The method of any of aspects 1 through 3, further comprising: determining that a downlink transmission associated with the code block group is scheduled for a set of time periods; refraining from processing the downlink transmission on at least one time period of the set of time periods; and determining the redundancy version for the retransmission of the code block group based at least in part on the refraining.

Aspect 5: The method of any of aspects 1 through 4, further comprising: estimating failure of an upcoming reception of a transport block associated with the code block group; and determining the redundancy version for the retransmission of the code block group based at least in part on the estimating.

Aspect 6: The method of any of aspects 1 through 5, wherein transmitting the indication of the redundancy version further comprises: transmitting, via uplink control information, the indication of the redundancy version for the retransmission of the code block group.

Aspect 7: The method of any of aspects 1 through 6, wherein transmitting the indication of the redundancy version further comprises: transmitting a negative acknowledgement message including the indication of the redundancy version for the retransmission of the code block group.

Aspect 8: The method of aspect 7, wherein the negative acknowledgement message comprises a set of bits indicating a starting position in a low-density parity-check code base graph.

Aspect 9: The method of any of aspects 1 through 8, wherein the UE and the base station support four or more than four redundancy versions.

Aspect 10: A method for wireless communication at a base station, comprising: receiving, from a UE, feedback information corresponding to a code block group in conjunction with an indication of a redundancy version for a retransmission of the code block group; and transmitting, to the UE, the retransmission of the code block group based at least in part on receiving the indication of the redundancy version for the retransmission of the code block group.

Aspect 11: The method of aspect 10, further comprising: transmitting, to the UE, a downlink transmission associated with the code block group comprising a plurality of code blocks, wherein receiving the indication of the redundancy version for the retransmission of the code block group is based at least in part on at least one code block of the plurality of code blocks not being processed at the UE.

Aspect 12: The method of any of aspects 10 through 11, wherein receiving the indication of the redundancy version further comprises: receiving the indication of the redundancy version for the retransmission of the code block group based at least in part on an incremental redundancy buffer status at the UE.

Aspect 13: The method of any of aspects 10 through 12, wherein receiving the indication of the redundancy version further comprises: receiving, via uplink control information, the indication of the redundancy version for the retransmission of the code block group.

Aspect 14: The method of any of aspects 10 through 13, wherein receiving the indication of the redundancy version further comprises: receiving a negative acknowledgement message including the indication of the redundancy version for the retransmission of the code block group.

Aspect 15: An apparatus for wireless communication at UE, comprising a memory, and a processor coupled to the memory and configured to perform a method of any of aspects 1 through 9.

Aspect 16: An apparatus for wireless communication at UE, comprising at least one means for performing a method of any of aspects 1 through 9.

Aspect 17: A non-transitory computer-readable medium storing code for wireless communication at UE, the code comprising instructions executable by a processor to perform a method of any of aspects 1 through 9.

Aspect 18: An apparatus for wireless communication at a base station, comprising a memory, and a processor coupled to the memory and configured to perform a method of any of aspects 10 through 14.

Aspect 19: An apparatus for wireless communication at a base station, comprising at least one means for performing a method of any of aspects 10 through 14.

Aspect 20: A non-transitory computer-readable medium storing code for wireless communication at a base station, the code comprising instructions executable by a processor to perform a method of any of aspects 10 through 14.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a wide variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus for wireless communication by a user equipment (UE), comprising:
   one or more memories; and
   one or more processors coupled to the one or more memories and configured to:
      transmit, to a base station, feedback information corresponding to a code block group in conjunction with an indication of a requested redundancy version for a retransmission of the code block group;
      receive, from the base station, the retransmission of the code block group in response to transmitting the feedback information; and
      decode the retransmission of the code block group in accordance with the requested redundancy version for the retransmission of the code block group.

2. The apparatus of claim 1, wherein the one or more processors and one or more memories are further configured to:
   receive, from the base station, a downlink transmission associated with the code block group comprising a plurality of code blocks; and
   determine that at least one code block of the plurality of code blocks is not processed at the UE, wherein transmitting the indication of the requested redundancy version for the retransmission of the code block group is based at least in part on the determining.

3. The apparatus of claim 1, wherein the one or more processors and one or more memories are further configured to:
   determine the requested redundancy version for the retransmission of the code block group based at least in part on an incremental redundancy buffer status, wherein transmitting the indication of the requested redundancy version for the retransmission of the code block group comprises transmitting the indication of the determined requested redundancy version.

4. The apparatus of claim 1, wherein the one or more processors and one or more memories are further configured to:
   determine that a downlink transmission associated with the code block group is scheduled for a set of time periods;
   refrain from processing the downlink transmission on at least one time period of the set of time periods; and
   determine the requested redundancy version for the retransmission of the code block group based at least in part on the refraining.

5. The apparatus of claim 1, wherein the one or more processors and one or more memories are further configured to:
   estimate failure of an upcoming reception of a transport block associated with the code block group; and
   determine the requested redundancy version for the retransmission of the code block group based at least in part on the estimating.

6. The apparatus of claim 1, wherein to transmit the indication of the requested redundancy version the one or more processors and one or more memories are further configured to:
   transmit, via uplink control information, the indication of the requested redundancy version for the retransmission of the code block group.

7. The apparatus of claim 1, wherein to transmit the indication of the requested redundancy version the one or more processors and one or more memories are further configured to:
   transmitting a negative acknowledgement message including the indication of the requested redundancy version for the retransmission of the code block group.

8. The apparatus of claim 7, wherein the negative acknowledgement message comprises a set of bits indicating a starting position in a low-density parity-check code base graph.

9. The apparatus of claim 1, wherein the UE and the base station support four or more than four redundancy versions.

10. A method for wireless communication at user equipment (UE), comprising:
    transmitting, to a base station, feedback information corresponding to a code block group in conjunction with an indication of a requested redundancy version for a retransmission of the code block group;
    receiving the retransmission of the code block group in response to transmitting the feedback information; and
    decoding the retransmission of the code block group in accordance with the requested redundancy version for the retransmission of the code block group.

11. The method of claim 10, further comprising:
    receiving, from the base station, a downlink transmission associated with the code block group comprising a plurality of code blocks; and
    determining that at least one code block of the plurality of code blocks is not processed at the UE, wherein transmitting the indication of the requested redundancy version for the retransmission of the code block group is based at least in part on the determining.

12. The method of claim 10, further comprising:
    determining the requested redundancy version for the retransmission of the code block group based at least in part on an incremental redundancy buffer status, wherein transmitting the indication of the requested redundancy version for the retransmission of the code block group comprises transmitting the indication of the determined requested redundancy version.

13. The method of claim 10, further comprising:
    determining that a downlink transmission associated with the code block group is scheduled for a set of time periods;
    refraining from processing the downlink transmission on at least one time period of the set of time periods; and determining the requested redundancy version for the retransmission of the code block group based at least in part on the refraining.

14. The method of claim 10, further comprising:

estimating failure of an upcoming reception of a transport block associated with the code block group; and determining the requested redundancy version for the retransmission of the code block group based at least in part on the estimating.

15. The method of claim 10, wherein transmitting the indication of the requested redundancy version further comprises:

transmitting, via uplink control information, the indication of the requested redundancy version for the retransmission of the code block group.

16. The method of claim 10, wherein transmitting the indication of the requested redundancy version further comprises:

transmitting a negative acknowledgement message including the indication of the requested redundancy version for the retransmission of the code block group.

17. The method of claim 16, wherein the negative acknowledgement message comprises a set of bits indicating a starting position in a low-density parity-check code base graph.

18. The method of claim 10, wherein the UE and the base station support four or more than four redundancy versions.

\* \* \* \* \*